United States Patent [19]

Ryan et al.

[11] Patent Number: 4,963,501
[45] Date of Patent: Oct. 16, 1990

[54] METHOD OF FABRICATING SEMICONDUCTOR DEVICES WITH SUB-MICRON LINEWIDTHS

[75] Inventors: Frank J. Ryan, Agoura; James W. Penney, Thousand Oaks; Aditya K. Gupta, Newbury Park, all of Calif.

[73] Assignee: Rockwell International Corporation, El Segundo, Calif.

[21] Appl. No.: 412,253

[22] Filed: Sep. 25, 1989

[51] Int. Cl.[5] .......................................... H01L 21/338
[52] U.S. Cl. ..................... 437/40; 437/29; 437/39; 437/41; 437/45; 437/59; 437/176; 437/203; 437/229; 437/912; 437/978; 437/946; 437/944; 148/DIG. 15; 148/DIG. 111; 148/DIG. 131; 148/DIG. 140; 156/643; 156/653; 156/657; 156/659.1; 357/15; 357/22
[58] Field of Search ............. 437/39, 40, 41, 44, 437/179, 912, 944, 946, 978, 29, 45, 59, 176, 203, 229; 156/643, 653, 659.1, 657; 148/DIG. 15, DIG. 111, DIG. 131, DIG. 140; 357/15, 22, 23.3, 23.12, 41

[56] References Cited

U.S. PATENT DOCUMENTS

| | | | |
|---|---|---|---|
| 4,636,822 | 1/1987 | Codella et al. | 437/41 |
| 4,670,090 | 6/1987 | Sheng et al. | 437/912 |
| 4,687,541 | 8/1987 | Penney | 156/643 |
| 4,731,339 | 3/1988 | Ryan et al. | 437/29 |
| 4,732,871 | 3/1988 | Buchmann et al. | 437/41 |
| 4,774,200 | 9/1988 | Nakajima et al. | 437/39 |
| 4,863,879 | 9/1989 | Kwok | 437/41 |

OTHER PUBLICATIONS

Yamasaki, K., et al., "GaAs Self-Aligned MESFET Technology: SAINT", *Review of the Electrical Communication Laboratories*, vol. 33, No. 1, 1985, pp. 122-129.

*Primary Examiner*—Brian E. Hearn
*Assistant Examiner*—T. N. Quach
*Attorney, Agent, or Firm*—Wilfred G. Caldwell; John C. McFarren; H. Fredrick Hamann

[57] ABSTRACT

Methods for reducing linewidths of Field Effect Transistors (FETs) and making FETs with 0.5 to 0.15 μm effective gate lengths are used separately or in a combined process sequence, that combines enhancement/depletion mode and microwave Metal-Semiconductors FETs (MESFETs) on the same GaAs chip. Photoresist linewidths are used to form dummy or substitutional gates using optical lithography with no deliberate overexposures. The dummy gate may be used as a mask for N+ implantation. The photoresist linewidth is then reduced in its lateral basewidth while preserving its height to basewidth aspect ratio in an isotropic oxygen plasma etch. A nonconformal dielectric film of silicon monoxide is deposited over the photoresist linewidth patterns. Dielectric reverse liftoff of the SiO pattern transfer dielectric provides a self-aligned stencil mask with respect to the N+/N− interfaces. The SiO stencil is also a dielectric spacer with respect to the N+/N− interfaces. The implantation profile's spatial variation with respect to the dielectric spacer dimension can be engineered to fabricate a lightly doped drain (LDD) MESFET. Finally, a Microwave Enhancement Depletion Integrated Circuit (MEDIC) process sequence mixes low threshold voltage digital MESFETs with higher threshold voltage microwave MESFETs.

20 Claims, 19 Drawing Sheets

GATE LENGTH UNIFORMITY

| WAFER# | AVG. (μm) | STD. DEV. (μm) |
|---|---|---|
| 104 | .274 | .017 |
| 106 | .262 | .017 |
| 101 | .262 | .017 |
| 105 | .273 | .019 |
| 100 | .305 | .022 |
| 102 | .260 | .016 |
| TW3 | .286 | .019 |
| TW2 | .285 | .014 |
| 103 | .260 | .015 |
| LOT | .274 | .0123 |

FIG.2  UNIFORMITY :—ACROSS WAFER — WAFER TO WAFER

|   |   |   | 23<br>0.16 | 22<br>0.13 |   |   | AVG. = .15 μm<br>STD. DEV. = .02 μm |
|---|---|---|---|---|---|---|---|
|   | 37<br>0.16 | 36<br>0.15 | 24<br>0.13 | 21<br>0.13 | 9<br>0.15 | 8<br>0.15 |   |
|   | 38<br>0.13 | 35<br>0.13 | 25<br>X | 20<br>0.15 | 10<br>0.13 | 7<br>0.17 |   |
| 44<br>0.16 | 39<br>0.13 | 34<br>0.13 | 26<br>0.15 | 19<br>X | 11<br>0.17 | 6<br>0.19 | 1<br>0.19 |
| 43<br>X | 40<br>0.13 | 33<br>0.13 | 27<br>0.16 | 18 | 12<br>0.13 | 5<br>0.16 | 2<br>0.19 |
|   | 41<br>0.14 | 32<br>0.14 | 28<br>0.14 | 17<br>0.17 | 13<br>0.16 | 4<br>0.15 |   |
|   | 42<br>0.12 | 31<br>0.15 | 29<br>0.14 | 16<br>0.16 | 14<br>0.16 | 3<br>0.15 |   |
|   |   |   | 30<br>0.16 | 15<br>0.11 |   |   |   |

FIG.3

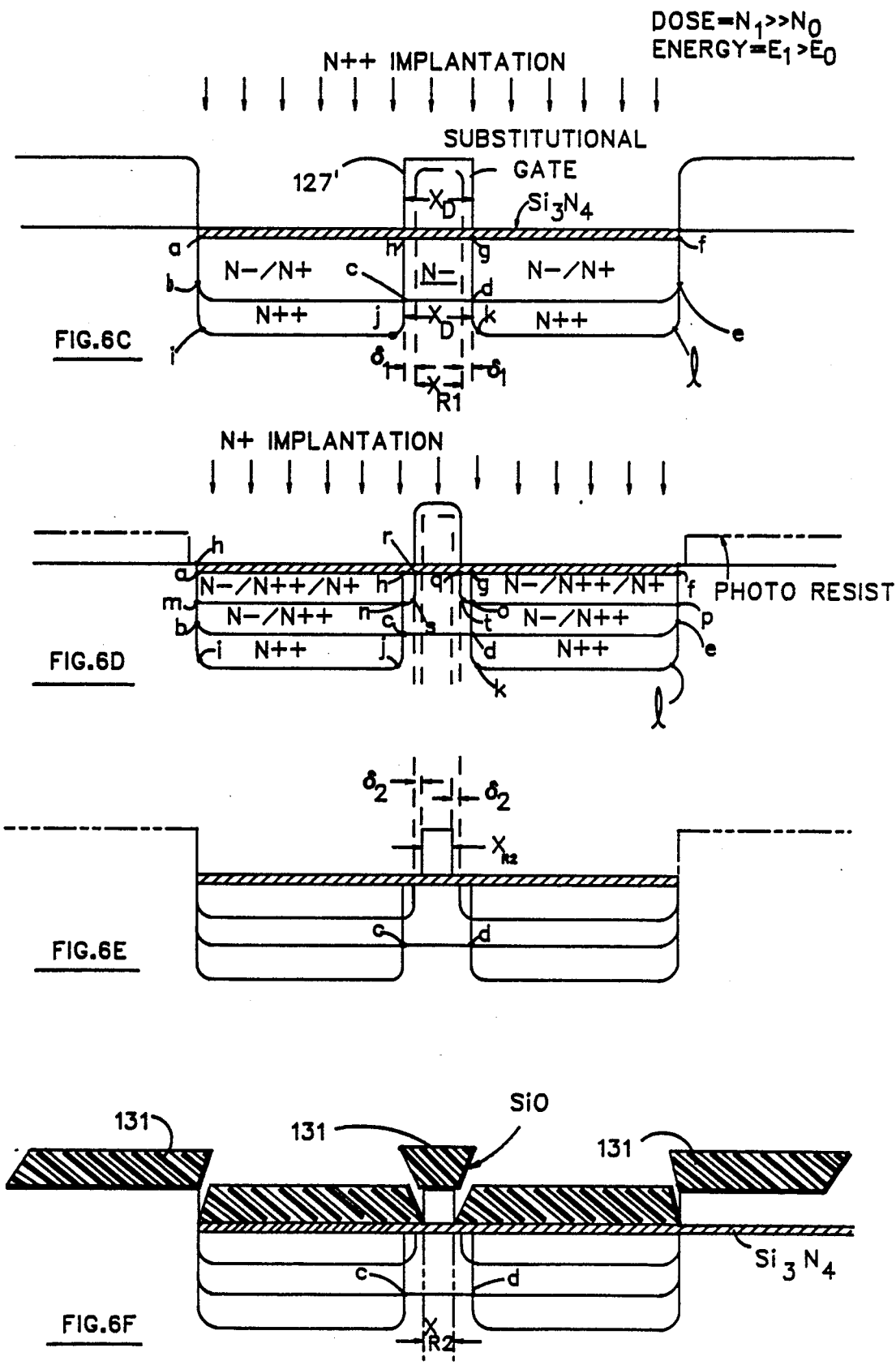

DIMENSION (BY EXAMPLE)
A=0.5μm
B=0.6μm
C=1.4μm
D=0.15μm
E=87.5μm

1st N+ ION-IMPLANTATION

1st GATE LENGTH REDUCTION

2nd N+ ION-IMPLANTATION (LDD ONLY)

2nd GATE LENGTH REDUCTION
(LDD FET ONLY)

BUFFERED HF DIP
(DIELECTRIC DOGEAR REMOVAL)

METHOD OF FABRICATING SEMICONDUCTOR DEVICES WITH SUB-MICRON LINEWIDTHS

BACKGROUND OF THE INVENTION

1. Field of the Invention

The invention relates to the laying down of linewidths or gaps and to the manufacture of FETs and MESFETs using a dummy gate approach to obtain linewidths down to 0.15 microns.

2. Prior Art

No other processes are known using dummy gates to these dimensions. However, in U.S. Pat. No. 4,731,339 to Ryan et al., assigned to the same assignee as the subject invention, a single level photoresist process is set forth which uses a dummy gate approach to reduce linewidths in the manufacture of MESFETs.

SUMMARY OF THE INVENTION

It is an object of the invention to provide a method for forming submicron linewidths, especially from the approximately 0.15 to 0.5 micron, using oxygen plasma etching of single-layer positive photoresist features on a GaAs wafer substrate.

It is an object of the invention to use pattern transfer dielectrics (such as silicon monoxide, SiO) to provide a high yield method for delineating these submicron gaps.

It is an object of the invention to use the delineated submicron gaps to define the effective metal gate lengths of GaAs MESFETs in these dimensions.

It is an object of the invention to sequentially fabricate digital enhancement/depletion MESFETs and microwave FETs in a combined process sequence on the same GaAs chip.

It is an object of the invention to fabricate one LDD FET structure for digital VLSI and microwave functions on the same GaAs chip.

According to the invention a new method of single level resist processing uses oxygen plasma etching that preserves the aspect ratio of photoresist linewidths down to at least 0.15 micron. The new method includes two photoresist linewidth reduction techniques. The first linewidth reduction technique etches nonimplanted photoresist to maintain good linewidth edge acuity and size, wafer to wafer, and to minimize linewidth variation across wafers (Method I). The second linewidth reduction technique uses self-aligned ion implantation of a photoresist dummy gate to lower the etch rate of the photoresist in oxygen plasmas (Method II). These techniques permit fabrication of digital and microwave MESFETs in the same process, including the making of LDD MESFETs.

BRIEF DESCRIPTION OF THE DRAWINGS

FIG. 2 shows the wafer to wafer and across wafer gate length uniformity; for a nominal < or =0.3 $\mu$m gate length, the across wafer standard deviations as shown ranging from 0.014 to 0.022 $\mu$m with a wafer to wafer average gate length of 0.274 $\mu$m and standard deviations of 0.0123 $\mu$m (Method I).

FIG. 3 shows the field by field gate length variation of nominal 0.15 $\mu$m gate length devices; shown are 44 fields on a 3 inch GaAs wafer (Method I).

FIGS. 6A-6L illustrate steps used to fabricate an LDD MESFET according to the invention.

DESCRIPTION OF THE PREFERRED EMBODIMENT

A process for reducing linewidths of FETs by photoresist linewidth reduction in an oxygen plasma and the subsequent formation of gate openings from 0.5 (or larger) to 0.15 micron wide has been developed to fabricate MESFETs with 0.5 to 0.15 gate lengths on 3 inch GaAs substrates. This process involves two methods: Method I uses oxygen plasma etching of non ion-implanted photoresist. Method 2 uses oxygen plasma etching of ion-implanted photoresist. The steps in the process used to fabricate sub half-micron gate length MESFETs are illustrated in FIGS. 1A-1J.

The basewidth dimension of the oxygen plasma etched photoresist linewidth (implanted or nonimplanted) is relpicated 1:1 by the pattern transfer dielectric SiO, down to 0.15 micron widths. The silicon monoxide is deposited by electron beam or thermal evaporation and the SiO gap is defined by dielectric reverse lift-off.

Sub-half micron gate metal lengths for GaAs MESFETs were defined using: N— channel ion implantation and activation, definition of sub-half micron gate openings to the N— channel surface, photolithogrphy, gate metal deposition, and reverse gate metal liftoff.

Secondly, a combined L band Microwave Enhancement-Depletion Integrated Circuit (MEDIC) process has been developed to fabricate FETs and N+ resistors for L band microwave and enhanced-depletion (E/D) digital circuits on the same GaAs chip. The proces approach uses Methods I and II to fabricate MESFETs and consequently provides the ability to mix low threshold voltage digital circuits with substantially higher threshold voltage microwave circuits on the same GaAs chip. The MEDIC process is compatible with conventional backside via and metallization. The process integration of the combined process sequence is described in FIGS. 11A-11L.

Finally an LDD (lightly doped drain) FET structure that is primarily for digital applications, utilizing Methods I and II can be constructed. The LDD MESFET minimizes subthreshold effects, imporves gate to drain voltage breakdown, and lowers gate to drain capacitance compared to a non-LDD MESFET. In addition, with or without a deep gate recess, the LDD MESFET can also lower the noise figure, minimize gate to drain capacitance coupling effects, and increase gmRds product. The LDD MESFET is illustrated in prespective view of FIG. 10, and in top view of FIG. 9. The steps in the LDD process to fabricate sub-half micron gate length MESFETs is illustrated in FIGS 6A-6L. The unique process steps necessary to incorporate an LDD MESFET in the combined MEDIC process is also described in the aforementioned FIGS. 11A-11L.

Sub-Half Micron Gate Length MESFET

The first embodiment describes in FIGS. 1A-1J the process used to fabricate GaAs MESFETs with gate lengths down to 0.15 micron or less. The process produces highly uniform sub-half micron dimensions using direct-step-on wafer (DSW) lithography for critical device dimensions, like the photoresist dummy or substitutional gate.

Figure 1A:
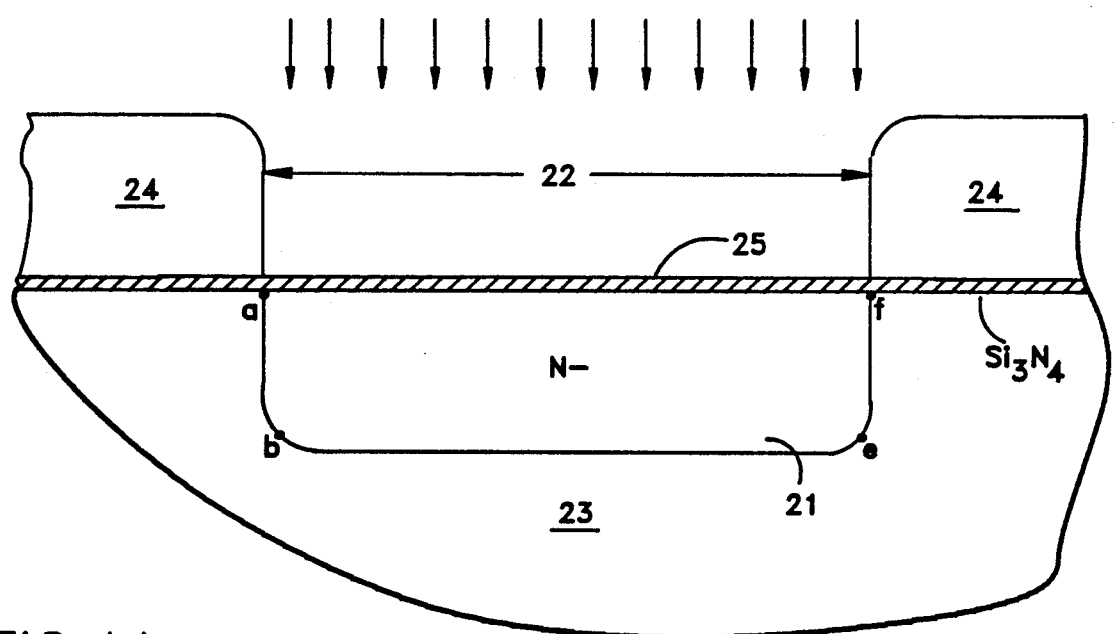
FIGS. 1A-1I illustrate steps used to fabricate a sub-half micron MESFET according to the invention.

In FIG. 1A, N— channel layer 21 is formed in a semi-insulating GaAs substrate 23 by ion implantation of Se,Si or SiF through a thin silicon nitride cap 25. Photoresist 24 defines opening 22 for the implantation. The selective N— channel implant is defined by the area enclosed by area gate abef. This process step also encompasses ion implantation directly on the bare GaAs surface as well.

Figure 1B:
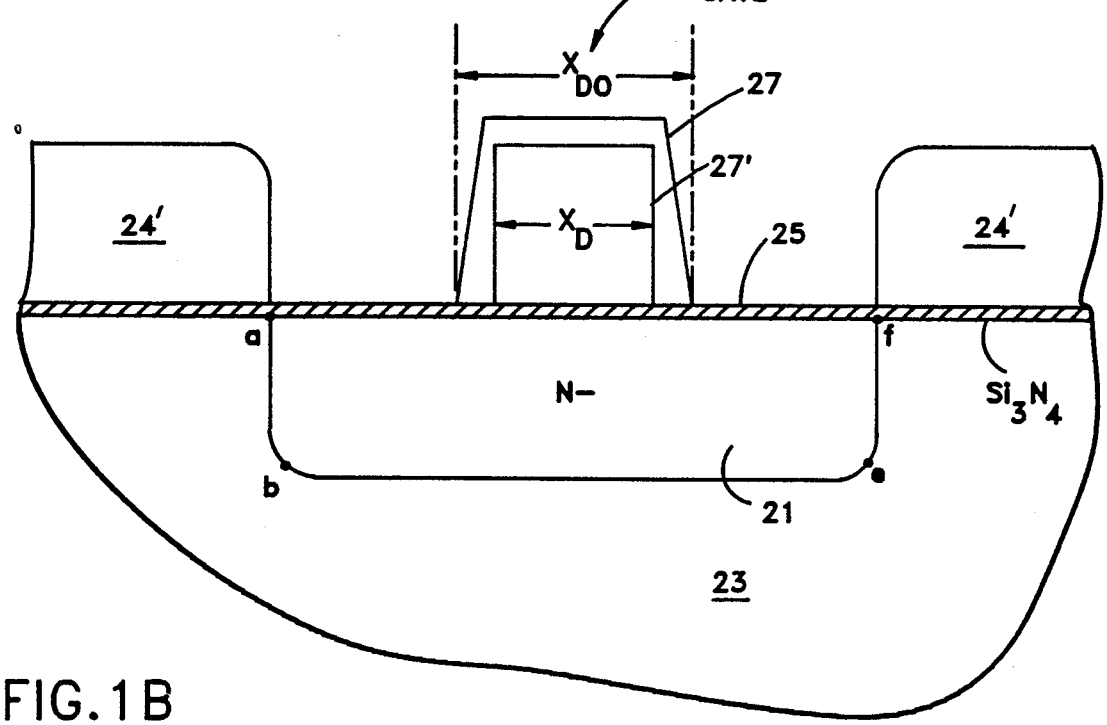

A photoresist substitutional or dummy gate 27 is optically defined using direct step on wafer (DSW) optical lithography for field effect transistors with a lateral dimension, $X_{Do}$, of 0.8 microns. The dummy gate is photolithographically defined at the N+ reticle. FIG. 1B shows a photoresist pattern that includes the dummy gate 27, and, also selectively defines the photoresist regions 24'. Gate length reduction of unimplanted photoresist in an oxygen plasma reduces the substitutional gate 27' dimension down to $X_D$, 0.6 micron (FIG. 1B). The parameters for oxygen plasma etching of unimplanted photoresist, (Method I) are itemized in Table E1.1.

Figure 1C:
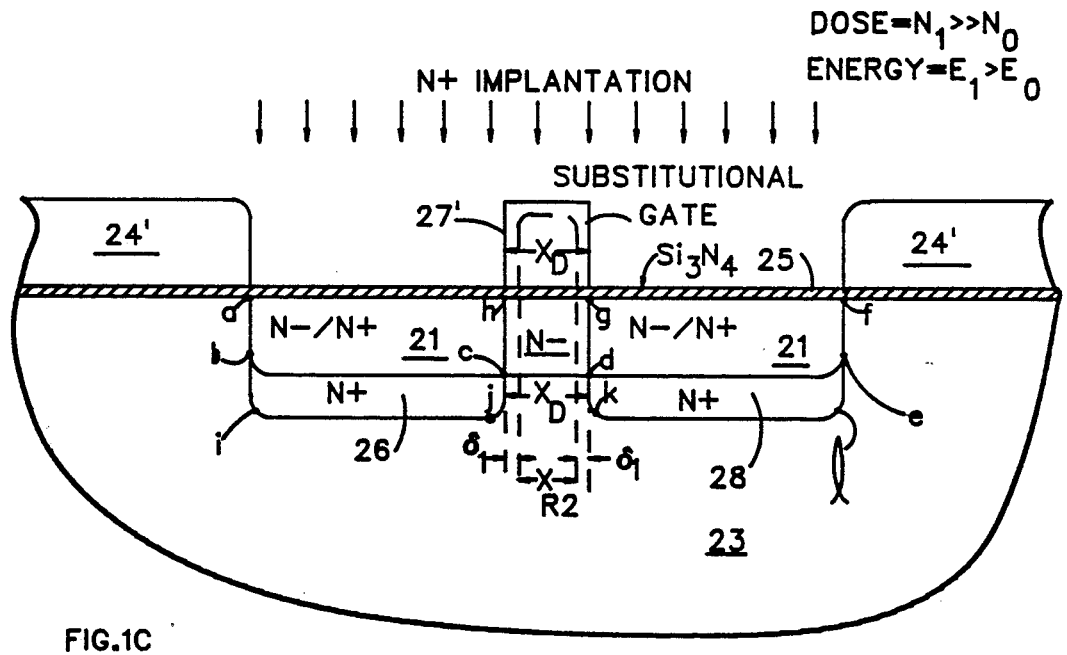

In FIG. 1C, N+ regions 26, 28 are defined by self-aligned Si or SiF N+ ion implantation, followed by another oxygen plasma gate length reduction down to an $X_{R2}=0.2$ μm. At this step a $\delta_1$ of 0.2 μm is removed in this gate length reduction step on each side. The parameters for oxygen plasma etching of ion implanted photoresist, (Method II) are also itemized in Table E1.1.

The N+ implant is aligned by the dummy gate 27' of basewidth dimension $X_D$, along segments hc and gd and is selectively defined by the area enclosed by areas abijch and felkdg.

Figure 1D:
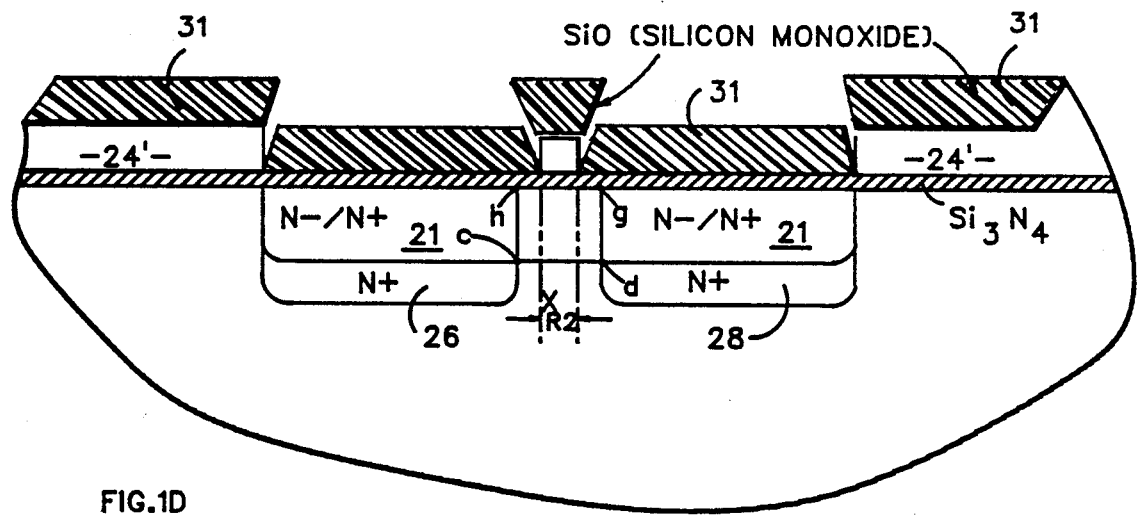

As shown in FIG 1D, a silicon monoxide film 31 of, e.g., 0.15 to 0.5 micron thickness is deposited by evaporation on the upper substrate surfaces ($Si_3N_4$), over the resist, and the substitutional or dummy gate pattern. The sharp breakage of the SiOx film during evaporation enables stencil pattern definition when the photoresist pattern and dummy gate is removed by acetone rinse and the subsequent dielectric liftoff. By example, the final lateral linewidth dimension, $X_{R2}$, delineates the 0.2 μm gate length opening at 53; also, about 0.2 μm of $SiO_x$ is left on the upper exposed surfaces from the evaporation step. Following lift off, the 0.2 μm of $SiO_x$ remains over the N+ regions 21 as shown in FIG. 1E.

$SiO_x$ means between $SiO_1$ and $SiO_2$.

Figure 1E:
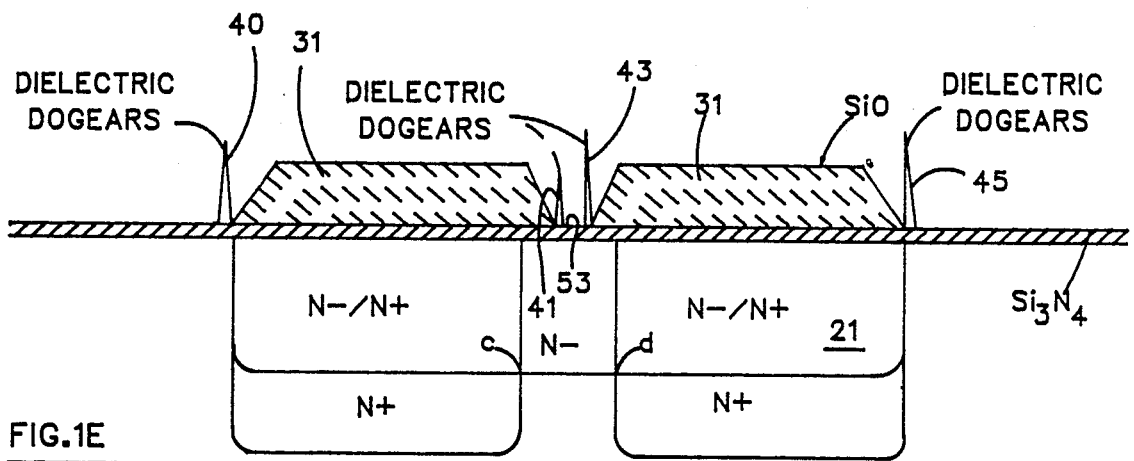

Openings in the range of 0.5 to 0.15 micron have been obtained, as shown at 53 in FIGS. 1D and 1E. It will be realized now that the dummy gate dimension, $X_{R2}$ is transferred by the dielectric deposition.

Figure 1F:
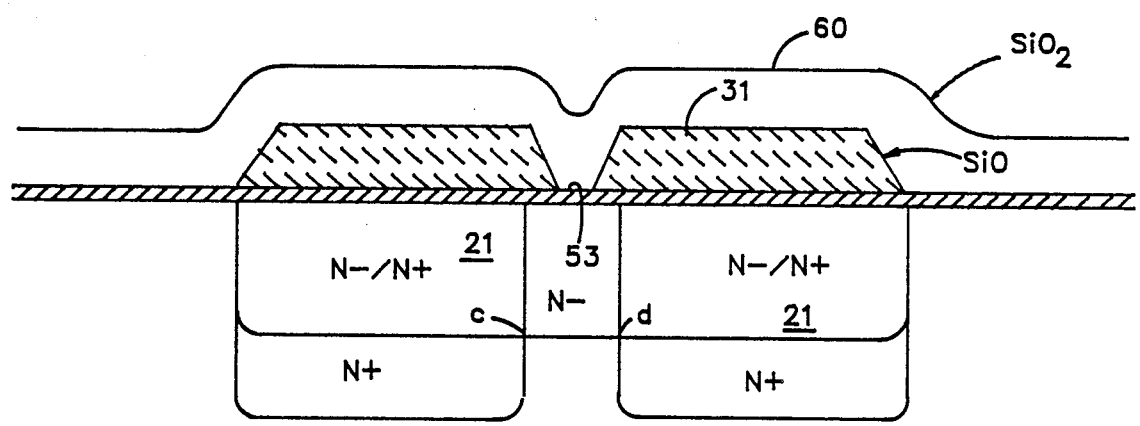

Next, in FIG. 1E, the dielectric dogears 40, 41, 43 and 45, formed during the deposition-lift off step, are removed by buffered HF dip (10:1 buffered HF for 30 seconds, followed by a two minute D.I. water rinse) resulting in a well defined gate opening 53 in FIG. 1F. The N+ implantation 21—21 along segments h c and g d are self-aligned to the gate opening 53 defined by the $SiO_x$ stencil 31 (FIG. 1D). $SiO_x$ regions 31 remained through lift off because of the 0.2 μm $SiO_x$ coating from the prior evaporation step.

The wafer with N+ regions is then coated with CVD deposited $SiO_2$ layer (approximately 1000 angstroms, FIG. 1F) at 380° C. to serve as an anneal encapsulant (see FIG. 1F). The wafer is then annealed at 850° C. for 10 to 20 minutes for activation and to minimize sideways or lateral diffusion of the N+ species into the gate region and to minimize transverse diffusion (impurity profile tailing) into the GaAs substrate. The $SiO_2$ anneal encapsulant or layer 60 is then selectively removed in 10:1 BHF for 3 minutes, and then rinsed for 2 minutes in DI $H_2O$.

Figure 1G:
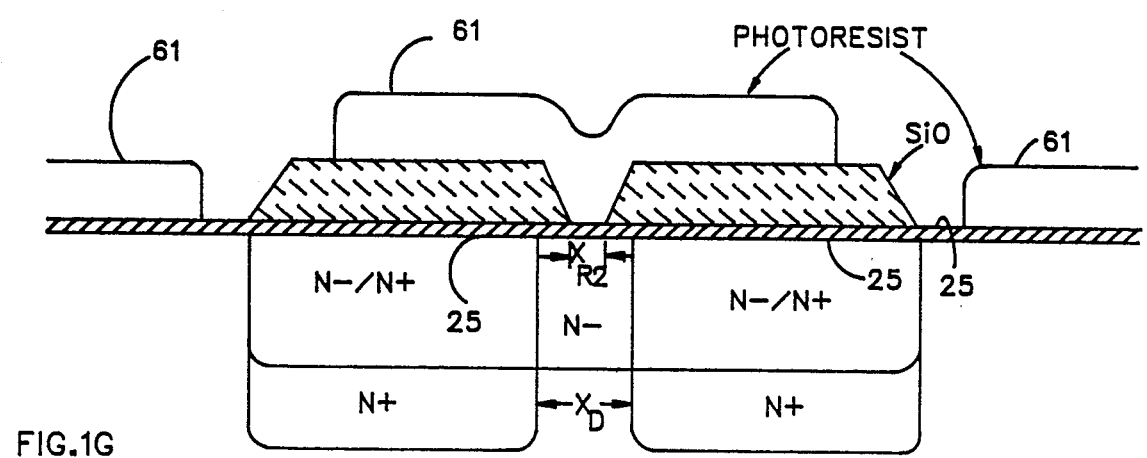

Ohmic resist patterning is defined with optical lithography and photoresist 61, as shown in FIG. 1G. Ohmic etch definition in a 9:1 RIE plasma of CHF3:02 (60 mT, rf power=400 W,V = —410 volts, etch time =9 min.) is used to etch the SiO (FIG. 1G) and to endpoint in the silicon nitride. An endpoint plasma etch of the silicon nitride to the GaAs surface is subsequently performed in a DE-100 plasma (600 SCCM flow, 420 to 470 mTorr and an rf Power of 300 watts for 3 to 7 minutes for a 350 to 750 angstrom silicon nitride film).

Figure 1H:
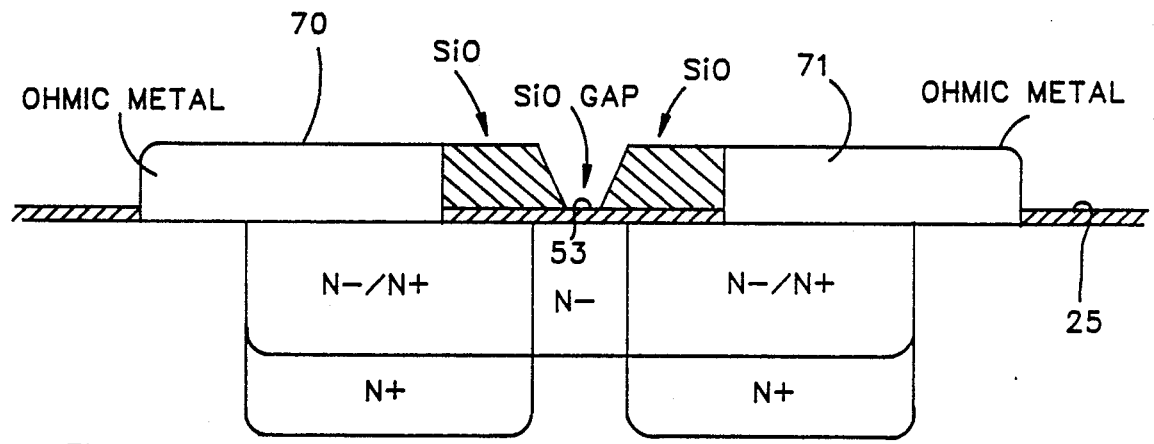

Ohmic metal 70,71 (FIG. 1H) is then deposited (Ni, AuGe, Ni and Au) followed by liftoff and ohmic alloy. FIG. 1H shows the FET structure cross-section prior to Schottky gate metal definition. The process can be designed so that the ohmic metal and SiO and $Si_3N_4$ are planar to minimize toplolgical variations at subsequent metal interconnection process steps. The SiO gap 53, shown in FIG. 1H, is used to define the opening of the $Si_3N_4$ down to the N+ channel region 21.

Figure 1I:
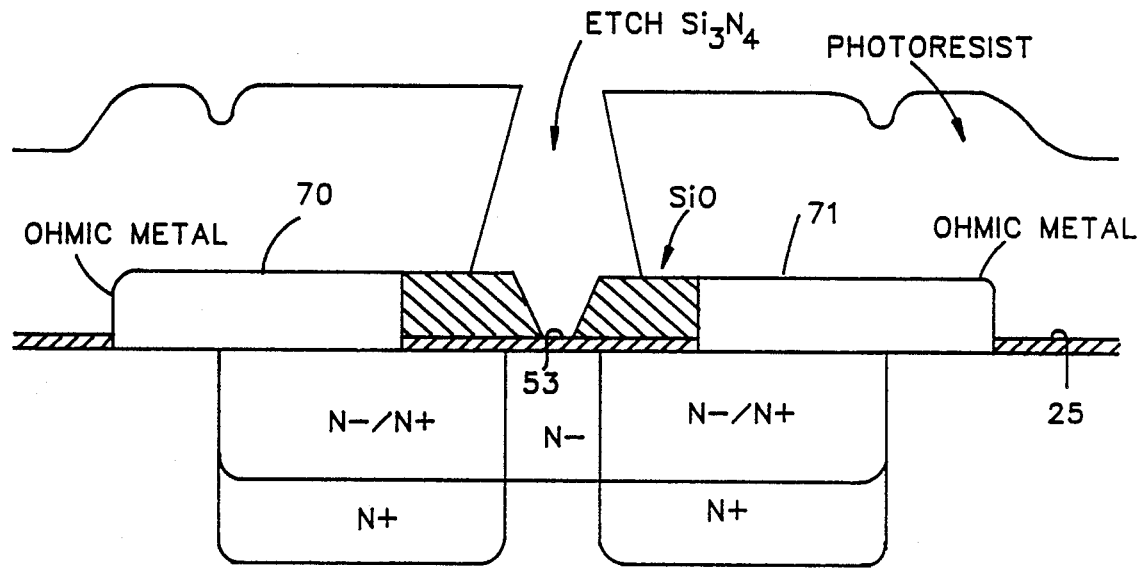

Schottky gate lithography with a retrograde profile is defined as shown in FIG. 1I, followed by a selective dielectric etch of the $Si_3N_4$ (at gap 53) with minimal undercutting and little or no widening of the SiO opening. The $Si_3N_4$ is plasma etched in DE-100 for 4 to 4.5 minutes (500 SCCM flow, 420 to 470 mTorr at an rf power +300 watts). The process delta during the dielectric etch is minimized by choosing the SiO thick enough to minimize widening the SiO opening. The $Si_3N_4$ dielectric etch parameters are chosen to minimize undercutting of the SiO. After dielectric gate etch, an optional gate recess can be performed. The device threshold voltage can be determined by direct ion implantation or with a subsequent gate recess performed after dielectric gate etch but prior to gate metal deposition.

Figure 1J:
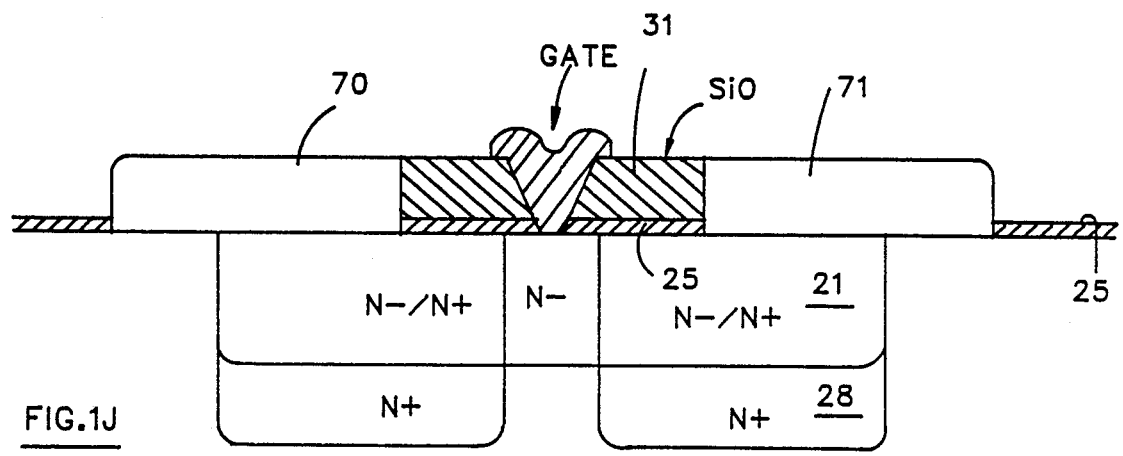
FIG. 1J shows the finished product ready to receive interconnects.

After gate metal deposition of Ti/Pt/Au and gate metal reverse liftoff, the FET is shown in cross-section in FIG. 1J. The drawing is scaled for the following dimensions by way of example only. For a 2500 angstrom SiO film a 0.3 to 0.5 micron SiO gate opening 53, the overlap capacitance of a 1.0 micron gate metal overlapping the SiO/Si3N4/GaAs regions is minimal, and is approximately 0.02 to 0.03 fF/um. This minimal overlap capacitance provides an excellent process advantage for LSI process control, namely that the gate photolithography misalignment tolerances of submicron gate length FETs are equivalent to tolerances for nominal one micron self-aligned gate FETs.

Finally, FIG. 1J represents the cross-section of a typical Enhancement-mode or Depletion-mode digital FET fabrication using Methods I and II in the combined MEDIC process.

Figure 4:
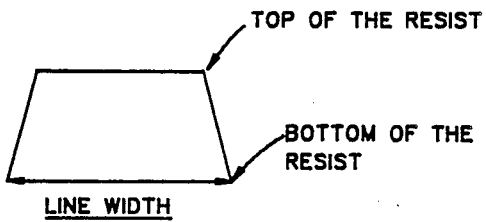
FIG. 4 tabulates the oxygen plasma etching parameters developed in an Anelva 506 for etching Shipley 1400-27 photoresist linewidths (Methods I, II).

FIGS. 2 and 3 show the results of applying Method I, namely, oxygen plasma etching of unimplanted photoresist (oxygen flow-100 SCCM p=245 mTorr, rf Power=250 watts, photoresist etch rate, see FIG. 4). The FIGS. 2 and 3 show the distribution across wafer and wafer to water, for the lateral basewidth of the dummy gate dimension after oxygen plasma etching, henceforth known as gate length reduction. The metrology was performed on cross-sectional cleaves of the dummy gates, using scanning electron microscope measurements.

In FIG. 2, the across wafer standard deviation in linewidths from a minimum of 0.014 to 0.022 $\mu$m, and the wafer to wafer standard deviation for an average linewidth of 0.274 $\mu$m was 0.0123 $\mu$m.

In FIG. 3, the across wafer standard deviation of 0.02 $\mu$m is shown for 44 stepper fields across a three-inch GaAs wafer for a nominal 0.15 $\mu$m linewidth.

The gate length reduction in an oxygen plasma is done as a batch process in an Anelva 506. The chamber conditions for Methods I and II are summarized in Table E1.1. (infra).

TABLE E1.1

| Gate Length Reduction Etch Chamber Parameters | | |
|---|---|---|
| | Method I (Unimplanted) | Method II (Implanted) |
| EQ-Type | Anelva 506 | Anelva 506 |
| Gas composition | 02 | 02 |
| Gas flow | 100 SCCM | 100 SCCM |
| Pressure | 245 mTorr | 245 mTorr |
| RF Power | 250 W | 350 W |
| Electrode dia. | 480 mm | 480 mm |

The submicron metrology measurements and the batch process approach to gate length reduction in an oxygen plasma demonstrates that less linewidth variation is achieved than using only conventional 10:1 direct step-on wafer (DSW) lithography. Finally S-parameter measurements indirectly confirm the measured effective metal gate length resulting from the invention.

Another measure of the dummy gate dimensional control is by comparing the across wafer and wafer to wafer standard deviations in threshold voltage, sigma $V_t$ for self-aligned gate digital MESFETs. The gate length reduction technique used was Method II, namely, oxygen plasma etching of Si-ion implanted photoresist (oxygen flow=100 sccm, P=245 mTorr, rf Power=350 watts, photoresist etch rate; see FIG. 4). Table E1.2 summarizes the excellent sigma $V_t$'s for 44 EFET test sites per wafer for 10 wafers in one lot fabricated in the combined MEDIC process. The effective gate length of the digital EFETs, Lg=0.8 $\mu$m. The average is $V_t$=0.234 V with a standard deviation, wafer, of 7.5 in V. The threshold voltage standard deviation across wafer, $\delta V_t$ ranged from 11 to 25 mV. For a self-aligned EFET, the excellent control of the effective gate length is demonstrated by the excellent threshold voltage uniformity.

TABLE E1.2

| Threshold Voltage Uniformity EFETs, MEDIC Process | | | | |
|---|---|---|---|---|
| O WAFER | # | 1 Q, DOSE (XE12 CM-2) | 2 Vt (VOLTS) | 3 SIGMA Vt (VOLTS) |
| 1 | 75 | 2 | 0.231 | 0.011 |
| 2 | 76 | 2 | 0.241 | 0.023 |
| 3 | 77 | 2 | 0.227 | 0.013 |
| 4 | 78 | 2 | 0.232 | 0.025 |
| 5 | 79 | 2 | 0.236 | 0.022 |
| 6 | 80 | 2 | 0.220 | 0.015 |
| 7 | 81 | 2 | 0.236 | 0.014 |
| 8 | 82 | 2 | 0.238 | 0.011 |
| 9 | 83 | 2 | 0.231 | 0.015 |
| 10 | 84 | 2 | 0.247 | 0.013 |
| | | <VT> | 0.234 | 0.016 |
| | | <$\delta$Vt> | 0.0075V | 0.005 |

44 test FET sites per wafer

Figure 5A:
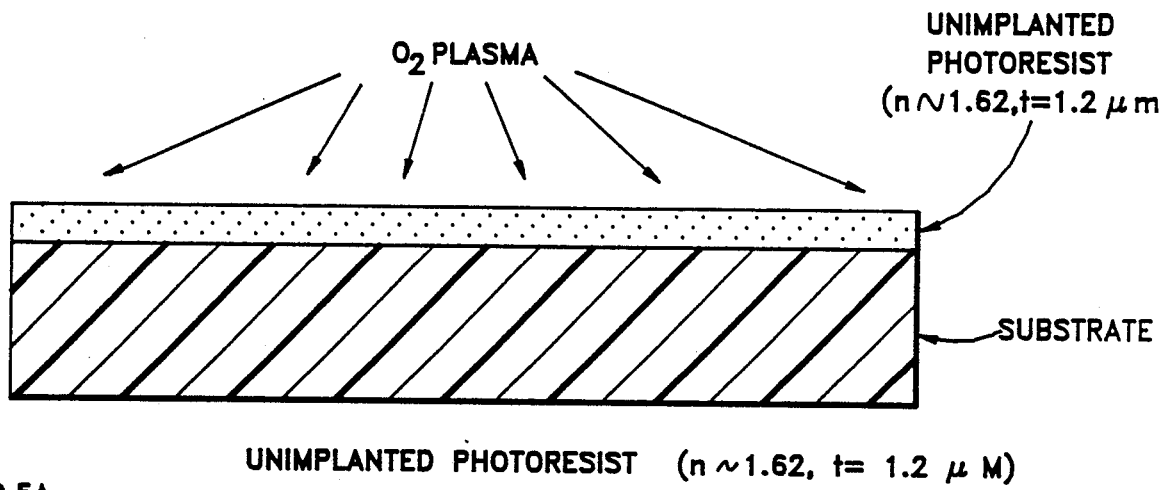
FIGS. 5A-5C depict the use of proposed mechanisms that support the photoresist etch rate differences at an rf power of 350 watts in an oxygen plasma; test wafers with photoresist, exposed to Si-29 doses from 8E12 to 2.0E13 cm-2 at 100,150,250, and 320 keV implant energies were measured using two-angle ellipsometry; the measured delta and ysi parameters were fitted to a double layer film, and the refractive index and thickness of the topmost film suggests a Si-suboxide with thickness from 60 to 100 angstroms.
Figure 5B:
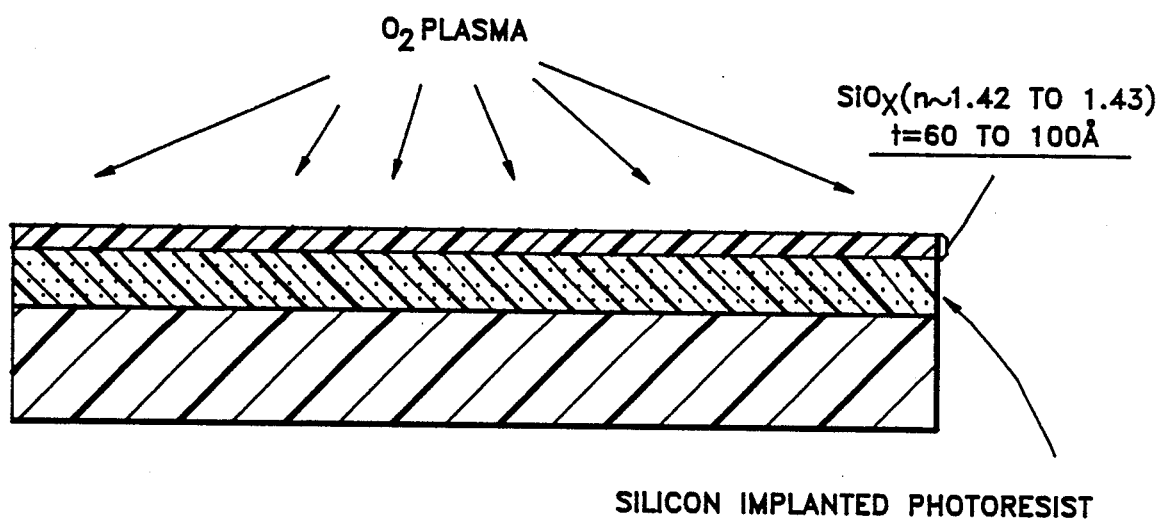
Figure 5C:
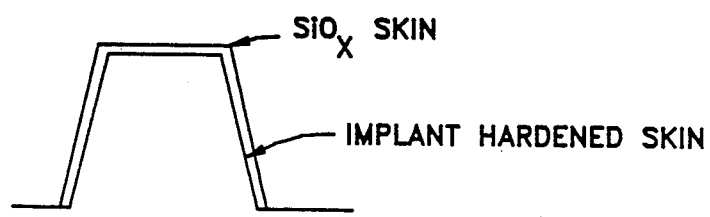
Figure 6A:
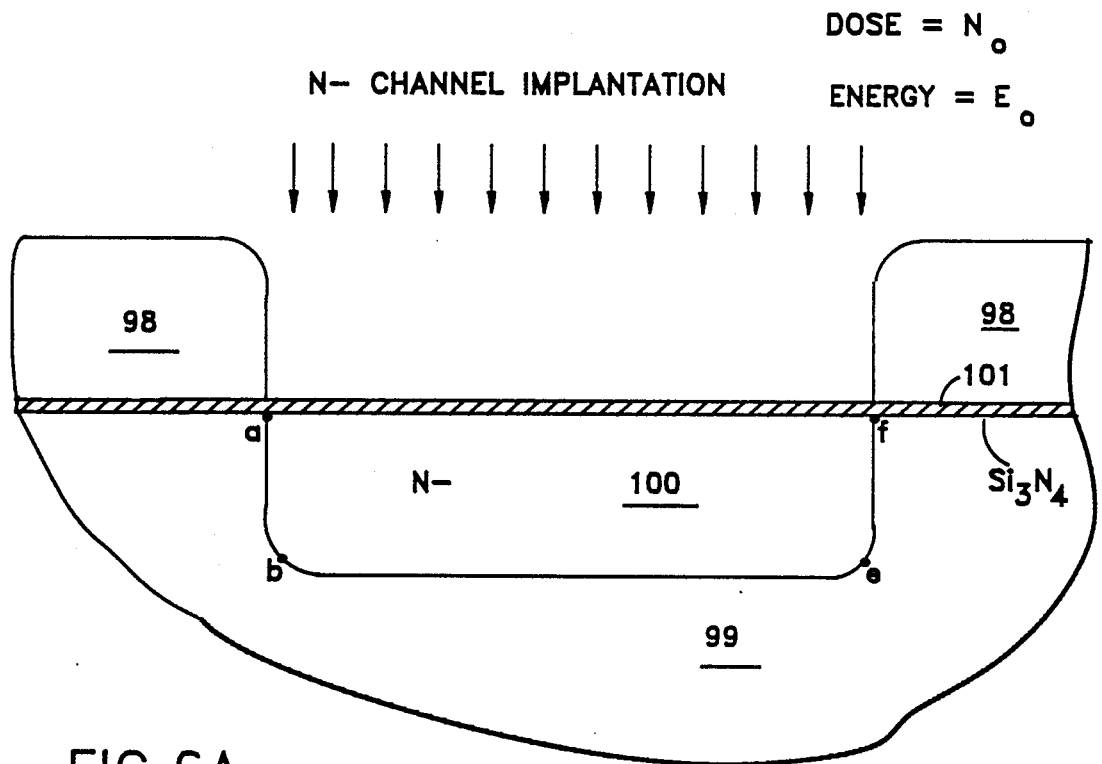
Figure 6B:
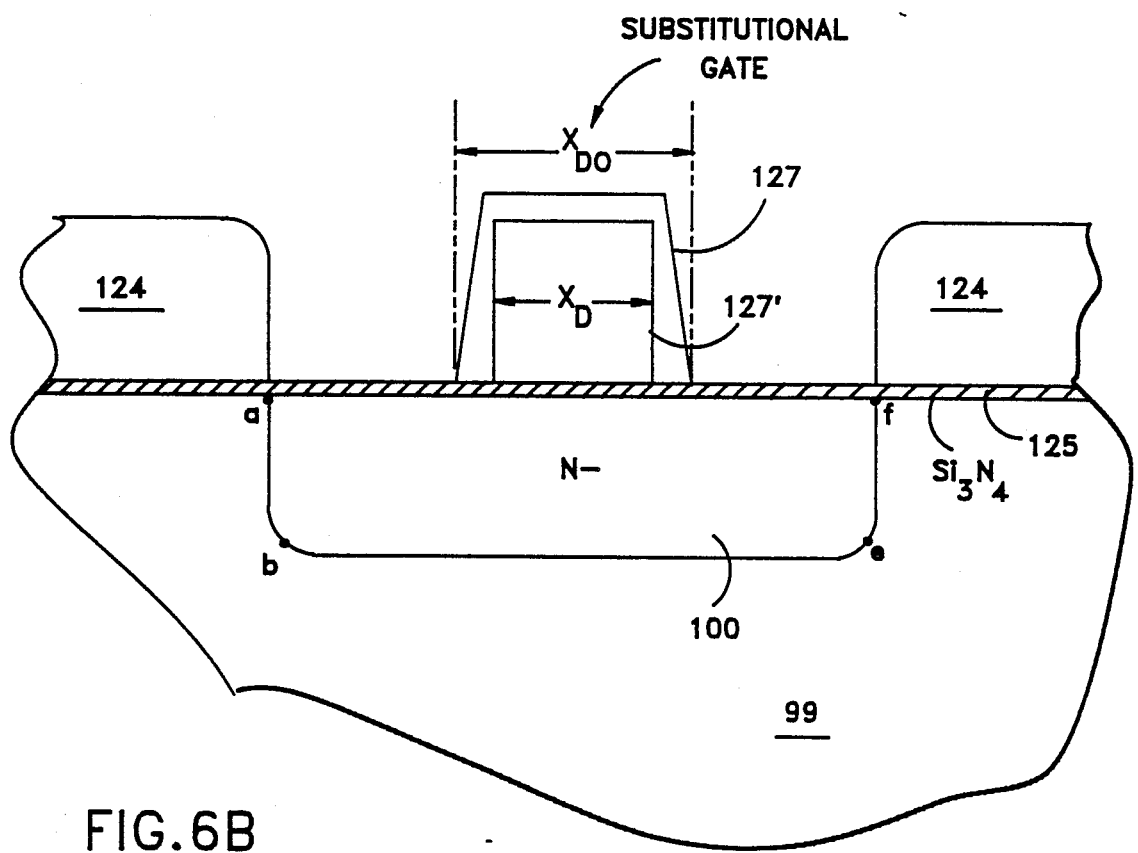
Figure 6G:
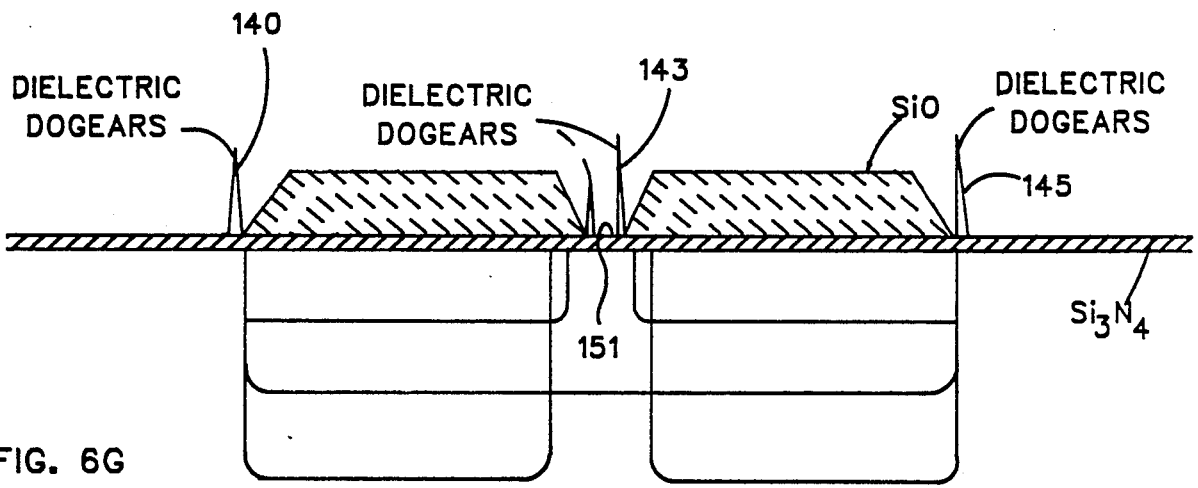
Figure 6H:
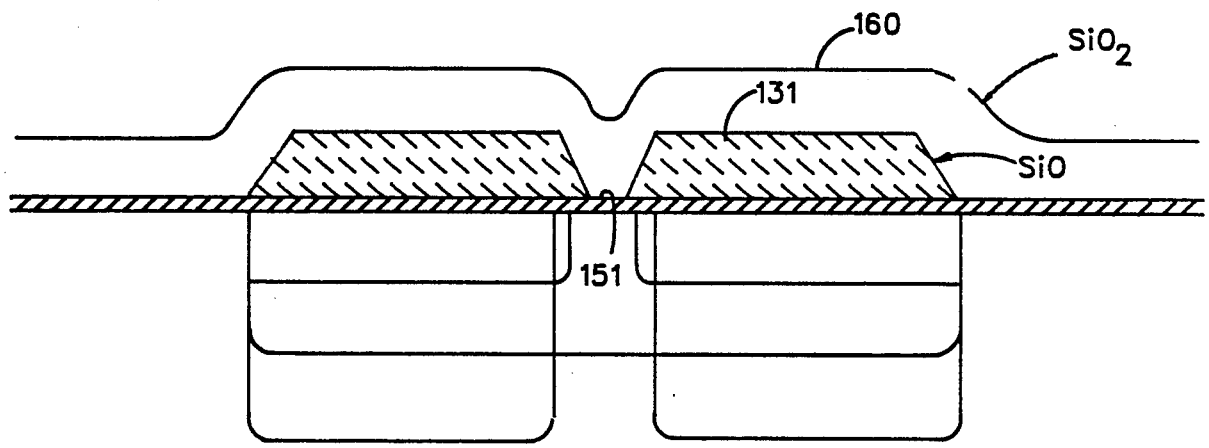
Figure 6I:
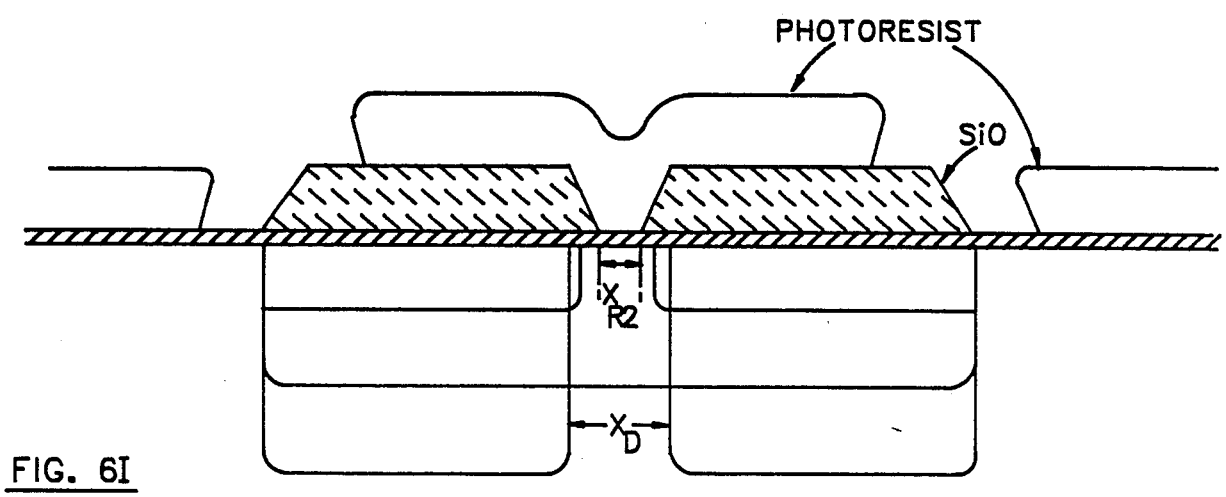
Figure 6J:
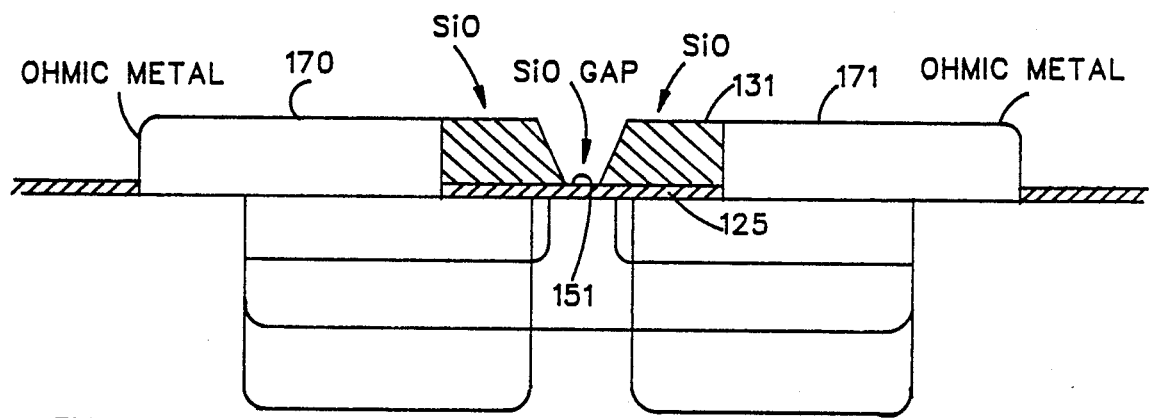
Figure 6K:
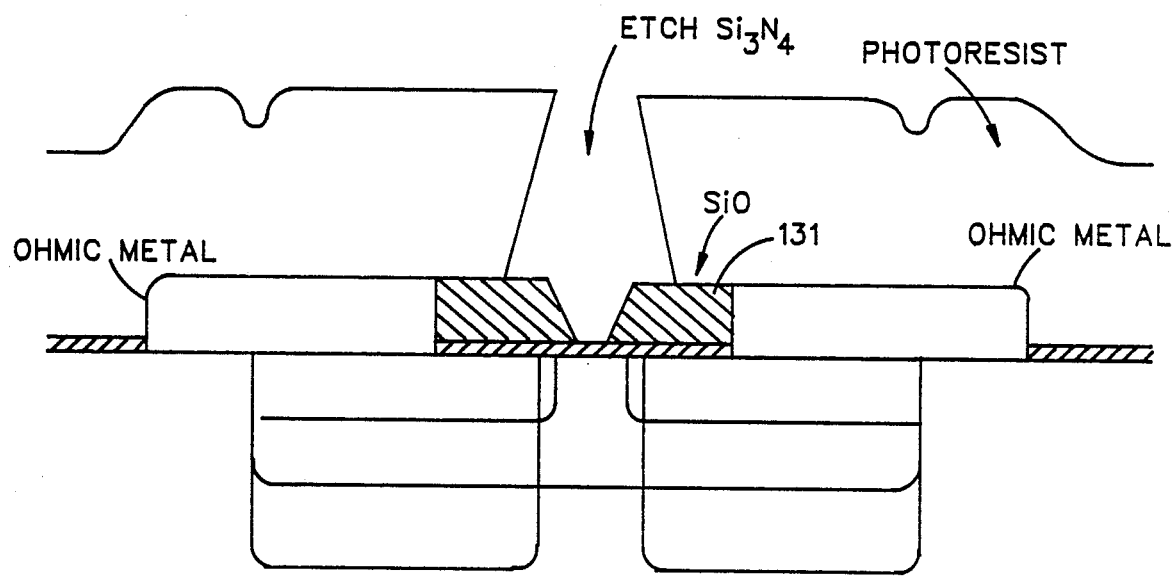
Figure 6L:
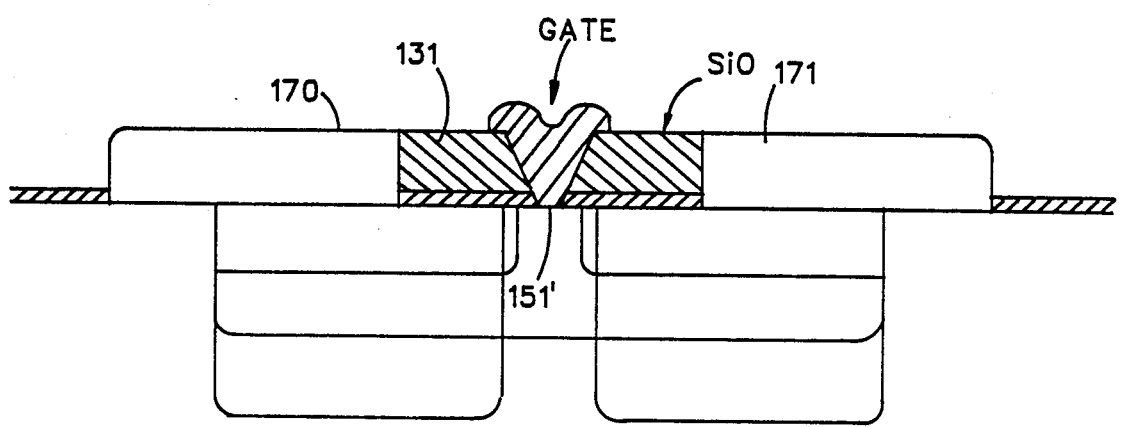

FIGS. 5A-C describe the proposed model/mechanisms for oxygen plasma etching of positive photoresist. The precise mechanism(s) that provide etch resistance of the photoresist is unclear, namely whether the excited oxygen plasma enhances or creates additional etch resistance (i.e., excited oxygen interacts with the implanted silicon in the resist that many result in a dynamic etch and remove, or gradual buildup of silicon suboxide) or whether the photoresist is simply hardened by ion implantation (FIG. 5C).

At an rf power of 350 watts, there is a marked decrease in photoresist etch rate when comparing Si-implanted to non-implanted photoresist deposited on dielectric-coated (or bare) semi-insulating GaAs substrates (FIG. 4). The etch rate is defined in FIG. 4 as the decrease in lateral basewidth of a photoresist linewidth with oxygen plasma on-time. Two layer multiple-angle-of-incidence ellipsometry measurements suggest the presence of a thin (60 to 100 angstrom) silicon suboxide layer (refractive index, n, 1.42 to 1.43 at a wavelength, lambda=6328 angstroms).

FIG. 5B is a model proposed for creation of the pseudo bi-level photoresist from single level positive photoresist exposed to Si-ion implantation and an oxygen plasma.

Finally non implanted photoresist on GaAs substrates, that is exposed to an oxygen plasma has a measured refractive index, typical of positive resist (FIG. 5A).

E 1.1 Glossary

1. Method I—oxygen plasma etching of unimplanted photoresist.
2. Method II—oxygen plasma etching of ion-implanted photoresist.
3. Dummy (or substitutional) gate—the photoresist linewidth feature which is used to geometrically define the lateral and transverse implant profile spatial variations by using it as an implant mask. Other self-aligned gate processes use the actual conducting gate electrode as the self-aligned implantation mask; the dummy gate is a substitutional gate, namely, it is removed prior to pattern transfer dielectric and gate metal definition.
4. Gate Length Reduction—using either Methods I or II to reduce the lateral basewidths of photoresist linewidths in an oxygen plasma. The process retains most of the height to width aspect ratio of a photoresist linewidth or dummy gate prior to SiO stencil pattern definition.

6. Process, and/or method (of invention)—fabrication of sub-half micron MESFETs using any combination of Methods I and II in the FET fabrication process sequence.

7. MEDIC process—a combined microwave-digital IC process (Microwave Digital Enhancement Depletion Integrated Circuit Process).

8. LDD FET—Lightly Doped Drain Field Effect Transistor.

9. Product (to be): uses digital E/D FETs, L band microwave FETs, and 20 GHz FETs.

E.2 Second Embodiment (combined process)

The second embodiment involves a monolithic fabrication process approach and sequence that uses the same active device topologies for FETs and resistors for microwave and digital circuits. The process sequence, namely, the implementation of Methods I and II, is essential in providing the ability to mix low threshold voltage digital circuits with substantially higher threshold voltage microwave circuits. The combined digital-microwave integrated circuit (IC) process is henceforth known as the Microwave Enhancement Depletion Integrated Circuit (MEDIC) process. In the combined process, the dimensions attainable are down to approximately 0.8 microns for the digital gate lengths, and down to approximately 0.4 microns for microwave gate lengths.

The process sequence and process integration of the invention is described in FIGS. 11A–L and Table E2.1.

TABLE E2.1

MEDIC (combined) PROCESS
(Detailed Description of each Step
Follows Process Step #17)

| PROCESS STEPS | DIG. | MIC. | RESULT |
|---|---|---|---|
| 1 Dielectric implant mask deposition (FIG. 11A) | X | X | 1. Shallow energy implants; (OPTIONAL) |
| 2. Alignment mark definition | X | X | 2. Front side processing and backside via alignment |
| 3. Selective channel implants (FIG. 11A) | X | X | 3. Channel implant profiles (Table E2.2 or E3.1) |
| 4. Dummy gate 227 definition (FIG. 11B) | X | X | 4. FIG. 11B |
| 5. Gate Length Reduction | X | X | 5. (OPTIONAL) FIG. 11C Table E1.1 |
| 6. 1st N+implant | X | | 6. N+implant for digital FETs; N+ Resistors defined here as well or at a sequential mask step (FIG. 11D) (Table E2.3) |
| 7. 1st Gate Length Reduction | X | X | 7. FIG. 11D; Table E1.1 |
| 8. LDD | X | X | 8. OPTIONAL (FIG. 11F; Table E2.3.1) |
| 9. 2nd Gate Length Reduction | X | X | 9. OPTIONAL (FIG. 11G; Table E1.1) |
| 10. SiO Deposition | X | X | 10. FIG. 11H; Table E2.4 |
| 11. Dielectric Liftoff | X | X | 11. FIG. 11-I |
| 12. Dielectric dogear removal | X | X | 12. FIG. 11J |
| 13. Gate Metal | X | X | 13. FIGS. 11K, L; |

TABLE E2.1-continued

MEDIC (combined) PROCESS
(Detailed Description of each Step
Follows Process Step #17)

| PROCESS STEPS | DIG. | MIC. | RESULT |
|---|---|---|---|
| | | | Table E2.5 |
| 14. Schottky Gate Metal Liftoff | X | X | 14. Gate metal defined in the FET with proper layout of Schottky gate tab for subsequent local and global metal interconnections |
| 15. 1st Level Interconnect | X | X | 15 Local interconnections and baseplate of the M-I-M coupling capacitors (Table E2.7) (See also FIG. 8) |
| 16. Interlevel Dielectric Deposition | X | X | 16. PECVD oxynitride; for interval dielectric and for coupling capacitors (Table E2.6) |
| 17. 2nd Level Interconnect | X | X | 17. Global interconnection to digital and microwave components (Table E2.7) |

Description for Table E2.1

Figure 11A:
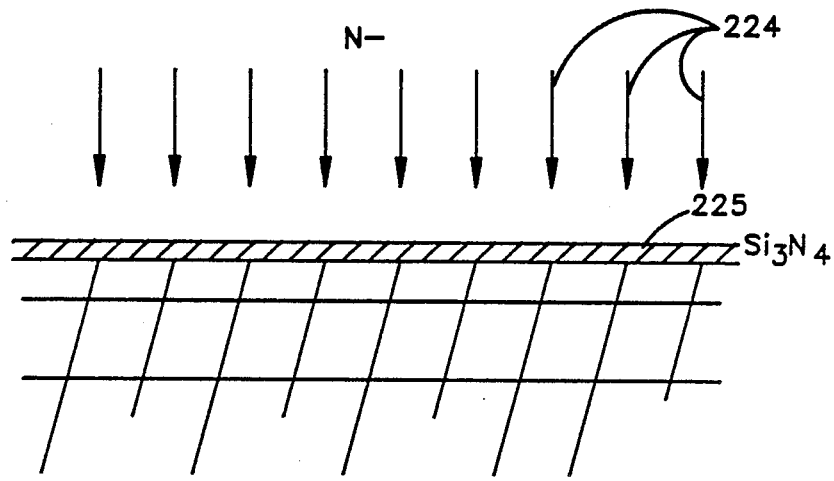
FIGS. 11A-11L illustrates steps in a process flow combined process (showing which steps are digital and which are microwave).
Figure 11B:
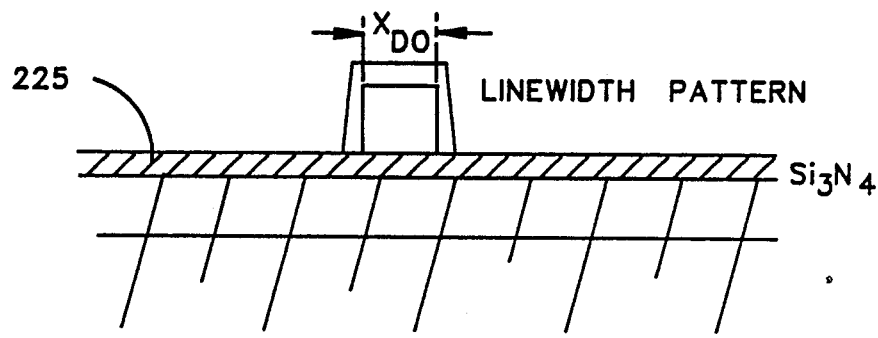

Process step #1:

In step #1 of FIG. 11A, the silicon nitride deposition 225 is a 350 angstrom thick film.

Both the digital and microwave channel implants are done through dielectric ion 225 by implantation 224. The dielectric deposition 225 is optional and both the digital and microwave implants can be done directly on bare GaAs. The channel implant species can be either Si, Se, or SiF.

Process step #2:

Alignment mark definition can either be on the implant dielectric or patterned in the GaAs. Small markers may also be added for backside via alignment. The same frontside alignment tree is used for both digital and microwave devices.

Process step #3:

Selective channel implants 224 are done with a photoresist defined pattern on either dielectric-coated or bare GaAs surfaces. The individual digital and microwave implants use separate reticle exposures.

Process step #4:

In FIG. 11B, the dummy gate 227 is optically defined usually at the N+ reticle. During dummy gate definition, the areas that are to be selectively implanted with N+ are also defined. The digital and microwave dummy gates can either be defined with the same or separate reticle exposures.

Figure 11C:
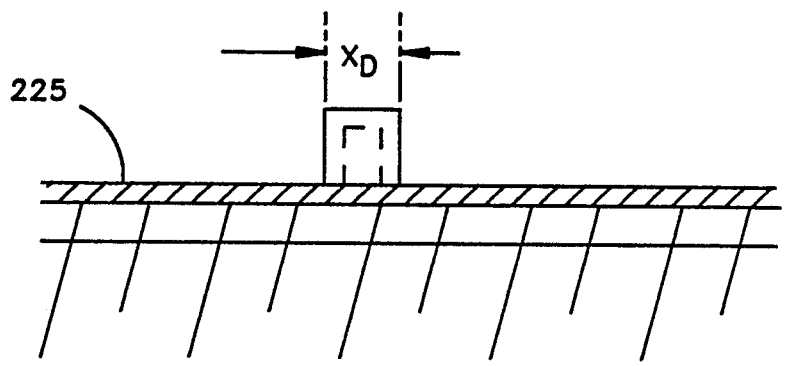
Figure 11D:
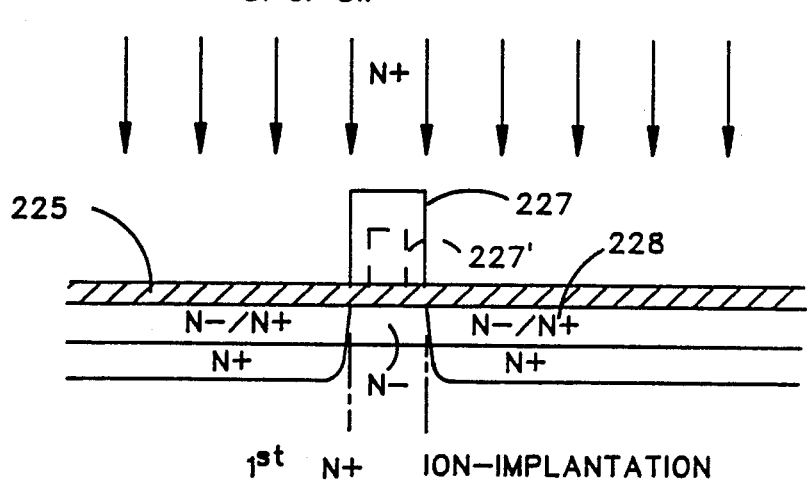

Process step #5:

In FIG. 11C, the gate length reduction to $X_D$ width of gate 227 is an optional process step that is shown in FIG. 11C for both digital and microwave devices.

Process step #6:

FIG. 11D shows the first N+ implant 228. At this process step the N+ implant for FETs and the N+ resistors can also be formed. If the N+ energy and doping parameters need to be different, then a separate N+ resistor reticle is used to pattern photoresist and another implant is done in the sequence. At this process step one has the option of using a lower N+ dose for the microwave FETs.

For digital FETs the first N+ implant is a heavily doped implant for both non-LDD and LDD FETs (Table E2.3.0).

Figure 11E:
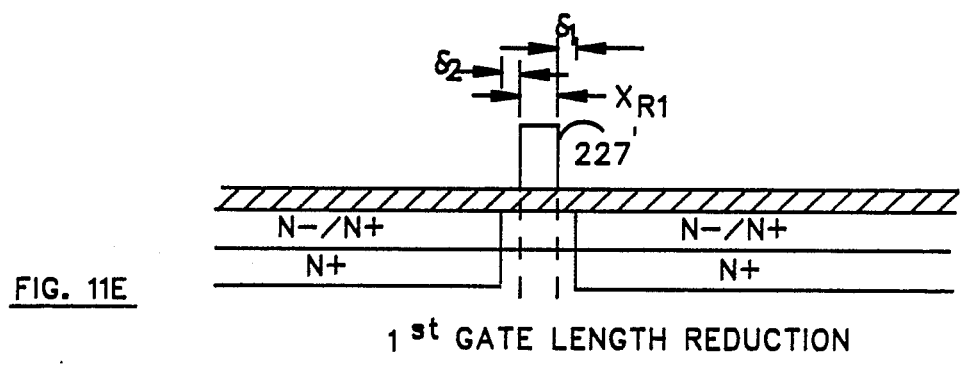

Process step #7:

FIG. 11E shows the results of the first gate length reduction after the N+ ion implantation. The lateral basewidth shrinkage can be done on the digital or microwave dummy gate simultaneously or separately depending on whether both the digital or microwave dummy gates are on the same or separate reticles. The dummy gate basewidth after gate length reduction is $X_{R1}=X_D-2\delta_1$.

Figure 11F:
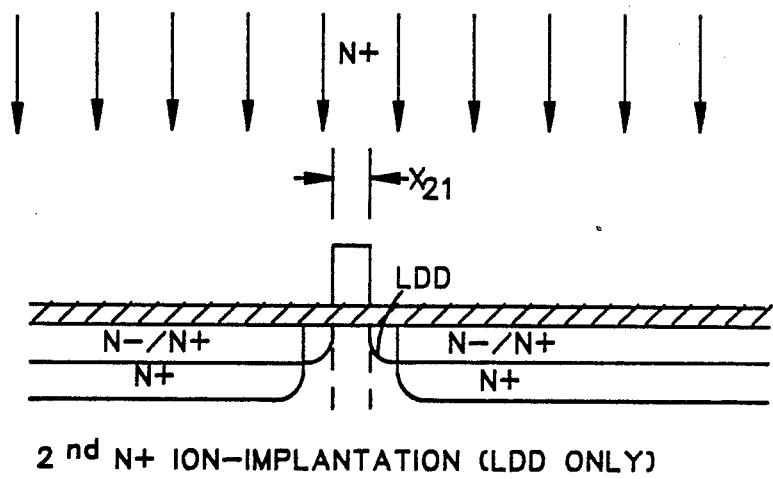

Process step #8:

FIG. 11F shows the second N+ ion implantation that can be done on either the digital or microwave devices. This second N+ ion implantation dose (see Table E3.1) is significantly lower than the first N+ ion implantation dose.

Figure 11G:
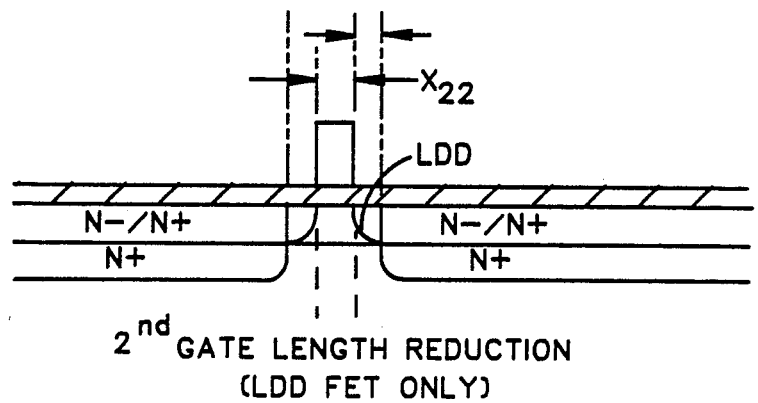
Figure 11H:
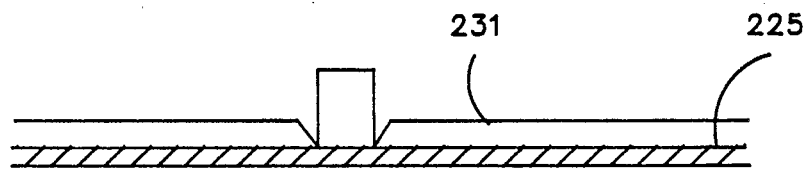
Figure 11I:
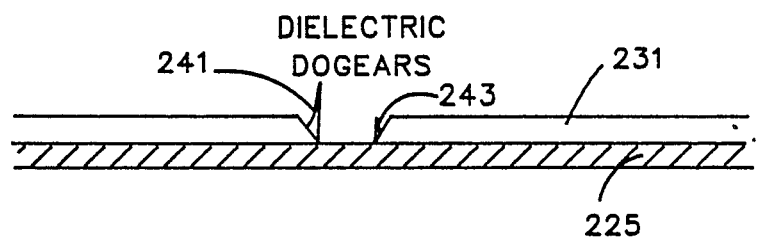
Figure 11J:
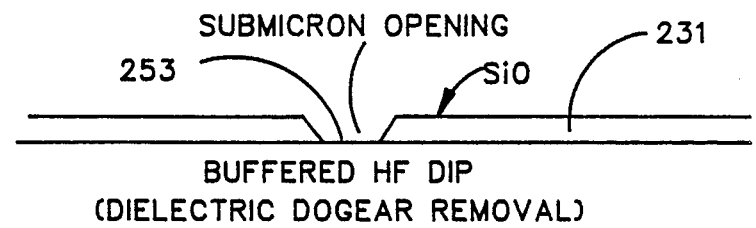
Figure 11K:
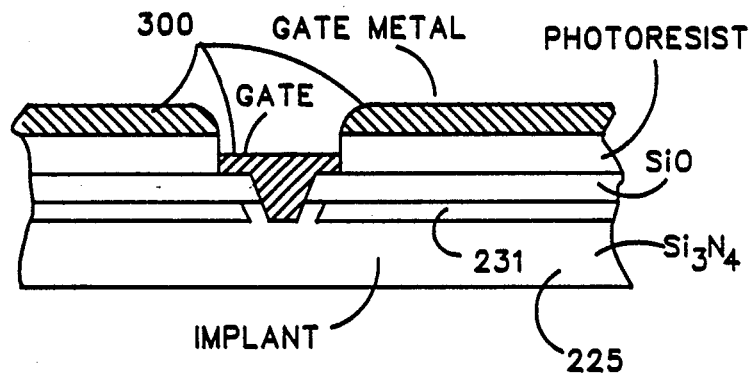

Process step #9:

FIG. 11G shows the second gate length reduction (LDD FET only) after N+ ion implantation. The second gate length reduction is done only if process step #8 is performed. The dummy gate basewidth after gate length reduction is $X_{R2}=X_{R1}-2\delta_2$.

Process step #10:

FIG. 11H shows the SiO deposited film on top of the dummy gate pattern. Both the digital and microwave devices use SiO (Table E2.4).

Process step #11:

The SiO is lifted off by removal of the N+ photoresist pattern 231 in acetone. During this process step the SiO gap or opening is formed as well as unwanted dielectric dogears.

Process step #12:

In FIG. 11J the dielectric dogears 241, 243 are removed by a buffered HF dip. This dielectric dogear removal step is critical for the formation of sub-half micron SiO openings 253. Not shown in FIG. 1J are the encapsulation deposition, activation anneal, and encapsulation removal process steps which were explained in FIG. 1F and page 8, lines 10-18. After encapsulation removal and prior to Schottky gate metal lithography, the ohmic contact lithography, dielectric etch, ohmic metal deposition and liftoff and ohmic alloy are performed to define the ohmic contacts to N+ resistors, digital and microwave FETs. These process steps are explained on page 8, lines 20-28 and page 9, lines 1-8.

Process step #13:

FIG. 11K shows the Schottky gate lithography (performed in sequence after encapsulation removal explained on page 8, lines 16-18) with Schottky gate metallization 300 deposited over the device structure. The Schottky gate lithography occurs first followed by dielectric etch and an optional gate recess. The Schottky gate metal is deposited and is now in contact with the GaAs in the channel as gate contact 300'.

Figure 11L:
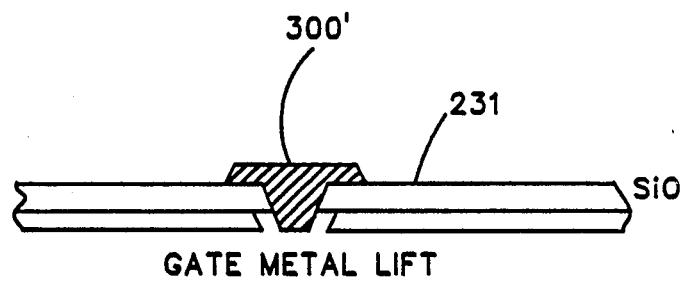

Process step #14:

The Schottky gate metal liftoff (and dielectric gate etch) process steps for microwave and digital FETs are identical to the liftoff and etch processes explained on page 9, lines 10-22. Process steps 15 to 17 are not unique to this invention but are used to provide digital and microwave interconnections in the combined process. Finally, FIG. 11L shows the MESFET after gate metal liftoff.

Figure 7:
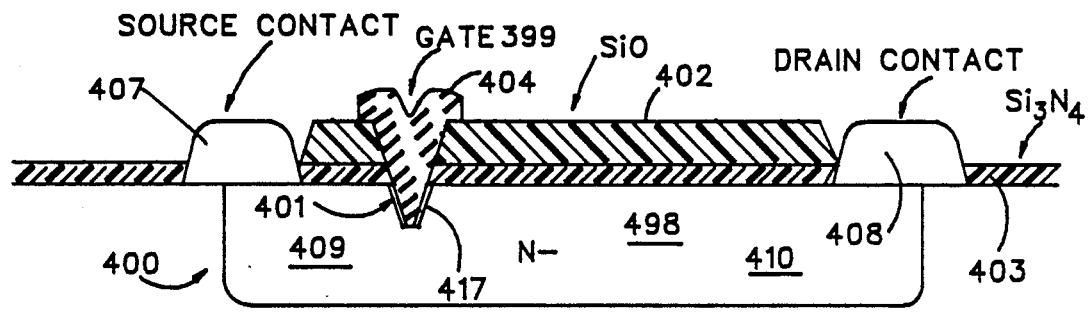
FIG. 7 device type A, is a cross-section of a typical L band microwave FET fabrication using Method I in the combined MEDIC process (Microwave Enhancement Depletion Integrated Circuit process).

FIG. 7 shows a sideview of a microwave MESFET 400 fabricated using the invention. An N- implant mask defines the implantation for source 409, channel 498, and drain 410. A gate recess 417 can be performed to tailor the rf profile. The gate recess is performed after microwave Schottky lithography patterning and dielectric etch to the GaAs surface but prior to Schottky gate metal deposition. The gate to source distance is spaced to optimize source resistance and gate to drain breakdown voltage.

Figure 8:
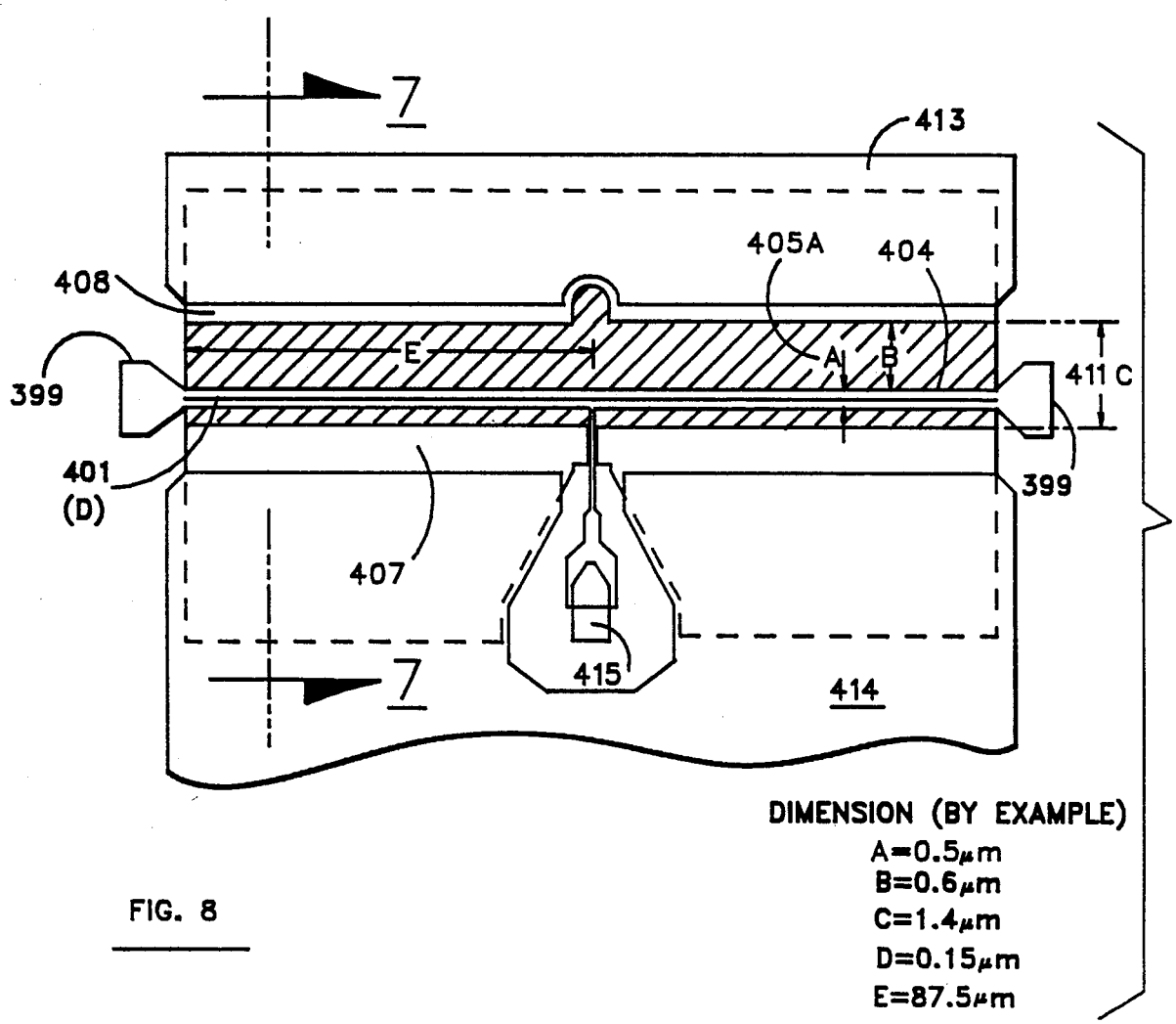
FIG. 8 device type B, is a top view of a microwave FET fabricated with Method I in accordance with FIG. 7.

The microwave FET 400 with a T-gate 399 is shown in sideview in FIG. 7 and in corresponding topview, with interelectrode spacings, in FIG. 8. The input matching network to the source 409 and drain 410 for the FET are not shown since they are not unique to the invention. The input matching network would include various series and shunt capacitors, as well as transmission line lengths. FIGS. 7 and 8 picture the microwave FET 400 with submicron gap 401, (typical for the combined process in 0.4 μm) is SiO 402 over Si3N4 403, gate metal 404 (gate metal width is 2 times dimension E), gate metal length 405A (typical for the combined process is 0.9 μm), ohmic metal 407 and 408 for source 409 and drain 410, source to drain length dimension 411 C (1.4 μm), gate offset to source dimension (C−(A+B)=0.3 μm), drain interconnect 413, source interconnect 414, gate interconnect landing pad 415, and gate recess 417.

As in the digital FET, the dummy gate patterning, gate length reduction, SiO gate opening definition, Schottky gate metal deposition and liftoff are used to define the effective gate metal length.

TABLE E2.2

| | N− channel Implant Parameters | | | |
|---|---|---|---|---|
| Specie | Process Step | Est. (E12 cm-2) Dose | Est. (keV) Energy | FET Type |
| Se | EFET | 2.0-2.5 | 120-250 | digital |
| SiF | EFET | 2.0-2.5 | 30-85 | digital |
| Se | DFET | 3.5-4.6 | 120-250 | digital |
| SiF | DFET | 3.5-4.5 | 30-85 | digital |
| Si | DFET | 8.0-9.0 | 100-140 | microwave |

TABLE E2.3.0

| | N+ Implant Parameters | | | |
|---|---|---|---|---|
| Specie | Process Step | Est. (E13 cm-2) Dose | Est. (keV) Energy | Device Type |
| Si | Self-aligned N+ | 2.0 | 100-150 | digital |
| SiF | Self-aligned N+ | 2.0-2.5 | 50-100 | digital |
| Si | N+ resistor | 0.8 | 200-250 | resistor (400 ohms/sq.) |
| Si | Self-aligned N+ (optional) | 0.7-1.0 | 50-100 | microwave |

TABLE E2.3.1

| | LDD Estimates - LDD N+ Implant Parameters | | | |
|---|---|---|---|---|
| Specie | Process Step | Est.(E12 cm-2) Dose | Est.(keV) Energy | Device Type |
| Si | LDD-N+ | 4.0-8.0 | 10-25 | digital |
| SiF | LDD-N+ | 4.0-8.0 | 20-70 | digital |

Note: Si and SiF implants of LDD-N+ (table E2.3.1) and the N+ (table E3.0) on bare GaAs use a tilt of 7 degrees and a rotation of 30 degrees. Silicon-29 implants through a sputter nitride capped GaAs surface use a tilt of 5 degrees and a rotation of 90 degrees.

TABLE E2.4

| | SiO Deposition Parameters* | | |
|---|---|---|---|
| Process Step | Thickness (ang.) | Uniformity (p/p), % | Initial Pressure (E-7T) |
| digital | 2000–2500 | +/−5% | 4.0 |
| microwave | 2000–2500 | +/−5% | 4.0 |

*electron-beam evaporation

TABLE E2.5

| | Gate Metal Parameters | | |
|---|---|---|---|
| Process Step | Metal Type | Thickness (ang.) | Rs (ohms/sq.) |
| digital (E,D) | TiPtAu | 300/300/(800–1000) | 0.15–0.30 |
| microwave | TiPtAu | 200/500/5000 | 0.02–0.03 |

TABLE E2.6

| | Oxynitride Parameters** | | | | |
|---|---|---|---|---|---|
| Thickness (ang.) | Uniformity ang. | R.I. | Uniformity | static dielec. Const. | dielectric stress (dynes/Cm²) |
| 5000 | +/−200 | 1.77 | +/−0.02 | 7.0 | (1–2.0) E9C |

**PECVD deposited T=280C, interlevel dielectric and also for the coupling capacitors. The dielectric stress is Compressive and is deposited in an ASM PECVD-II dielectric deposition system.

TABLE E2.7

| | Interconnection Metal Parameters | | |
|---|---|---|---|
| Process Step | Metal Type | Thickness (ang.) | Rs (ohms/sq.) |
| local interconnection | Ti/Au | 300/(2700–3500) | 0.06–0.08 |
| global interconnection | Ti/Au | 300/8000 | 0.03–0.035 |

E.3 Third Embodiment (LDD FET Structure)

Conventional submicron gate length GaAs and silicon devices use complex processing and conformal dielectrics to form dielectric spacers to achieve a lightly doped drain (LDD) implant profile. In the process described herein, a two-step ion implantation and multiple gate length reduction are used to provide the same effect. The LDD process utilizes a nonconformal pattern transfer dielectric to achieve the lightly doped drain implant profile necessary for optimum transistor performance.

E3.1 Process Flow Sequence (Reference to Drawings, FIG. 6)

1. (FIG. 6A)

Define a selective N− channel pattern with optical lithography using photoresist 98 on GaAs wafer 99. The N− channel implant is defined by the area 100 enclosed by points abef. Ion implantation through sputtered silicon nitride 101 (approximately 350 angstroms) is shown with an N− channel implant of energy Eo and dose No (cm-2). This process step encompasses ion implantation of bare and dielectric capped semiconductors. A typical range of estimated parameters is summarized in Table E3.1. For ion implantation through a 350 angstrom $Si_3N_4$ cap 101, a tilt of 5 degrees and a rotation of 90 degrees is used. The dense $Si_3N_4$ cap (refractive index=1.99–2.00, wet etch rate in full strength HF of 3 to 3.5 angstroms/sec) is used to dechannel the ion beam to achieve a minimum sigma $V_t$. For direct ion implantation of SiF-47, a tilt of 15 degrees minimizes axial channeling. A rotation of 30 degrees minimizes planar channeling in (100) semi-insulating GaAs substrates by choosing a rotation angle that is not a multiple of 45 degrees from the [011] crystallographic direction. The aforementioned dechanneling tilt and rotation parameters should provide a minimum threshold voltage standard deviation, sigma $V_t$ for an electrostatically X-Y scanned ion implanter on three-inch GaAs substrates.

TABLE E3.1

| | LDD Estimates N− channel Implant Parameters | | | | | |
|---|---|---|---|---|---|---|
| Specie | Implant Approach | Est. Dose (E12 cm-2) | Est. Energy (keV) | Tilt (deg.) | Rot. (deg.) | FET Type |
| SiF-47 | GaAs | 2.0–3.0 | 20–55 | 15 | 30 | E |
| Se | (350 ang. $Si_3N_4$)/ GaAs | 2.5–3.5 | 95–105 | 5 | 90 | E |

*Rotation is defined as measured clockwise from the major flat of (100) GaAs, as the ion beam 'sees' or is incident to the GaAs circuit-side surface.

2. (FIG. 6B)

This figure defines the substitutional (or dummy) gate 127 photoresist linewidth with direct step-on wafer (DSW) optical lithography for FETs with a linewidth lateral dimension, $X_{Do}$. Gate length reduction of unimplanted photoresist, Method I, to dimension $X_D$ with oxygen plasma etching (see Table E1.1 for chamber etch parameters) is shown by dummy gate 127'.

3. (FIG. 6C)

FIG. 6C shows the effects of ion implantation of the first N++ implant with energy E1 and dose N1 (see Tables E2.2, 2.3) such that E1>Eo and N1>>No. The N++ regions abijch and felkdg are aligned to the substitutional gate. The N++ profile in combination with the N− channel profile minimizes the source resistance of the FET without increasing the FET capacitance. The source resistance and FET capacitance are minimized by optimizing implant dose N1 proximity to the gate edge with respect to source and the drain electrodes; as well as the ratio of implant energies of E1 to Eo.

The N++ to N++ separation, $X_D$, at the cd intersection between the FET source and drain, determines the magnitude of average K-value with drain to source bias, Vds. The same region of the FET referenced by line segment cd causes short-channel conduction currents through the semi-insulating substrate that degrades or increases output conductance at subthreshold (FET in the OFF condition) and saturation (FET in the ON condition). The short channel effect is minimized at the N−/semi-insulating interface by having an $X_D$=0.8 μm (see FIG. 6C) for the final gate dimension opening, $X_{R2}$=0.2 μm (see FIG. 6I). The result is that a 0.2 μm=$X_{R2}$, gate length device will have the short channel effect of a much larger gate length device. In practice, short channel effects for a nominal one micron gate length self-aligned GaAs MESFET are negligible provided the doping profile is optimized.

Finally, one has the option to increase the gate to drain breakdown voltage by doing an angle ion implantation with source-side of the FETs closest to the incident ion beam. The dummy gate which is 1.2 to 1.4 μm high will provide a shadowing effect that minimizes the N++ doping on the drain side of the dummy gate, thereby increasing the gate to drain breakdown voltage.

4. (FIG. 6D)

The first gate length reduction (see also FIG. 11D and process step #7, Table E2.1), of the combined process) after the N++ ion implantation reduces the substitutional gate dimension $X_D$ by oxygen plasma etching of ion-implanted resist, Method II. The gate reduction dimension, delta-1 is equally removed from each side of the substitutional gate. The dummy gate dimension is now $X_{R1}$ where $X_{R1}=X_D-2*$ (delta-1).

The LDD ion implantation is performed next, with the second N+ (energy E2, dose N2, see Table E2.3.1) with E2>Eo, and N2>or=to (2No), where No dosage is the order of the depletion FET channel dosage (approximately (4 to 5) E12 cm-2, SiF or Si). The second N+, or LDD-N+ (N2,E2) provides a lighter implant dosage and depth that the first N++ implant (N1,E1). The LDD-N+ regions, amsy and fpog are aligned to the substitutional gate with a dummy gate dimension, $X_{R1}$ (FIG. 6D).

The LDD N+ implant is chosen to lower the fringing capacitance at the edges of the gate-source and gate-drain regions (regions hrsn and qgot FIG. 6D). In addition, the two-step N+ implant gate reduction process minimizes gate-drain leakage current where the FET is in the off condition (subthreshold region). Since $X_D=X_R-2*$ (delta 1), then the gate to drain leakage current component originating in the FET channel from the N+/N− interface nearest the substrate (region jcdk, FIG. 6D) is minimized. The remaining gate to drain leakage current contribution is located at the top surface of the channel near the gate perimeter edges (regions hnsr and gotq, FIG. 6D). The LDD N+ implant minimizes the additional gate to drain excess gate edge leakage current from gate to source and maintains the low source to drain subthreshold leakage.

(FIG. 6E)

The second gate length reduction (see also, FIG. 11G, of the combined process) after the first N++ ion implantation defines the final gate length of the field effect transistor. Gate reduction Method II (see Table E1.1) is used to remove delta-2 of photoresist on each side of the substitutional gate. The substitutional gate lateral width $X_{R2}=X_{R1}-2*$ (delta 2). This process step allows for a final gate length dimension $X_{R2}$ in the range of 0.15 to 0.20 μm.

(FIG. 6F)

The silicon monoxide 131 is deposited over the substitutional gate lithography by electron-beam or thermal evaporation. Table E2.4 in the combined process section summarizes the SiO deposition parameters. The thickness of the SiO is chosen to minimize the process deltas, and define the gate opening, and to minimize gate metal overlap capacitance from gate to source. The substitutional gate dimension $X_{R2}$ is transferred by this dielectric deposition.

(FIG. 6G)

A liftoff process is performed leaving an SiO stencil which defines the sub-half micron (0.2 to 0.15 μm) gate length opening 151 (=$X_{R2}$). Dielectric dogears 140, 141, 143, 145, formed during the deposition-liftoff steps are removed by a buffered HF dip previously detailed, resulting in a well-defined gate length opening, 151.

(FIG. 6H)

The $SiO_2$ encapsulant 160 is deposited and an implant anneal is performed. The $SiO_2$ is then selectively removed leaving the self-aligned dielectric 131 intact.

(FIG. 6I)

Ohmic resist patterning with a retrograde profile is defined by optical lithography. Ohmic windows are delineated by plasma etching of silicon nitride to the GaAs surface.

(FIG. 6J)

Ohmic metal is then deposited followed by liftoff and ohmic alloy.

(FIG. 6K)

Schottky gate lithography with a retrograde profile is defined followed by selective dielectric etch of $Si_3N_4$ with little or no widening of the SiO opening 151. The SiO 131 is chosen thick enough to minimize widening of the SiO opening during the gate etch and thin enough for a good dielectric liftoff (see FIG. 6G).

(FIG. 6L)

A wet or dry gate recess can be performed to adjust threshold voltage of the LDD FET. The optional recess is followed by a metal deposition and liftoff to define the effective Schottky gate metal length 151' of 0.2 to 0.15 μm.

In conclusion, the two step, N++ and LDD N+ and gate reductions are critical for optimizing digital FET characteristics. The process can lower ohmic contact resistance by providing a high and lower N+ doping and depth implant profile. This vertical scaling will also minimize the lateral N+ straggle that occurs during implant anneal activation. One also can include buried p-layers, buffer layers, or other various homo- and heteroepitaxial device structures utilizing (Al,-Ga,As and In,Ga,As,P) III-V semiconductors to improve device performance below and above threshold.

Figure 9:
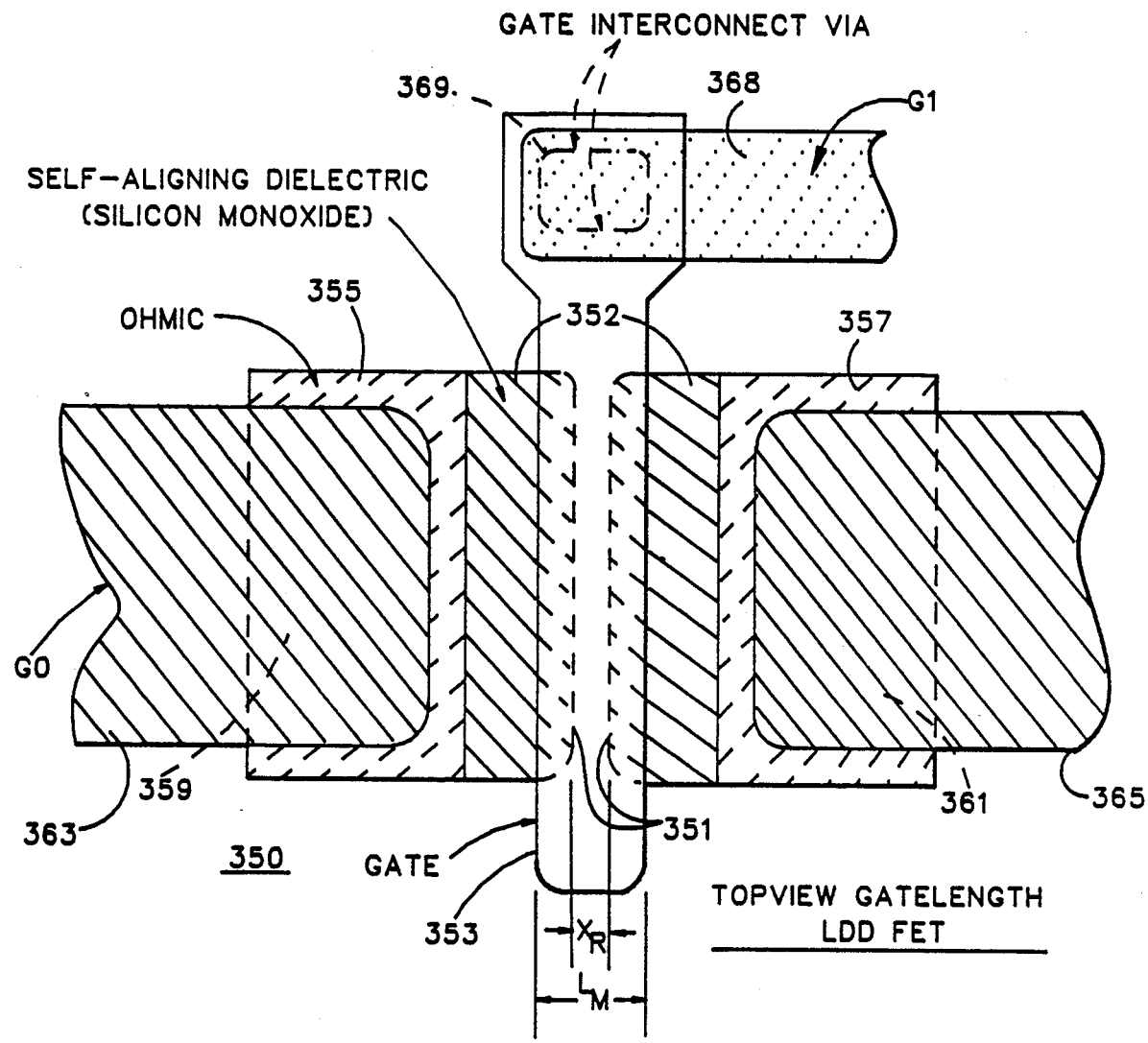
FIG. 9 is a top view of a submicron gate length LDD FET device.
Figure 10:
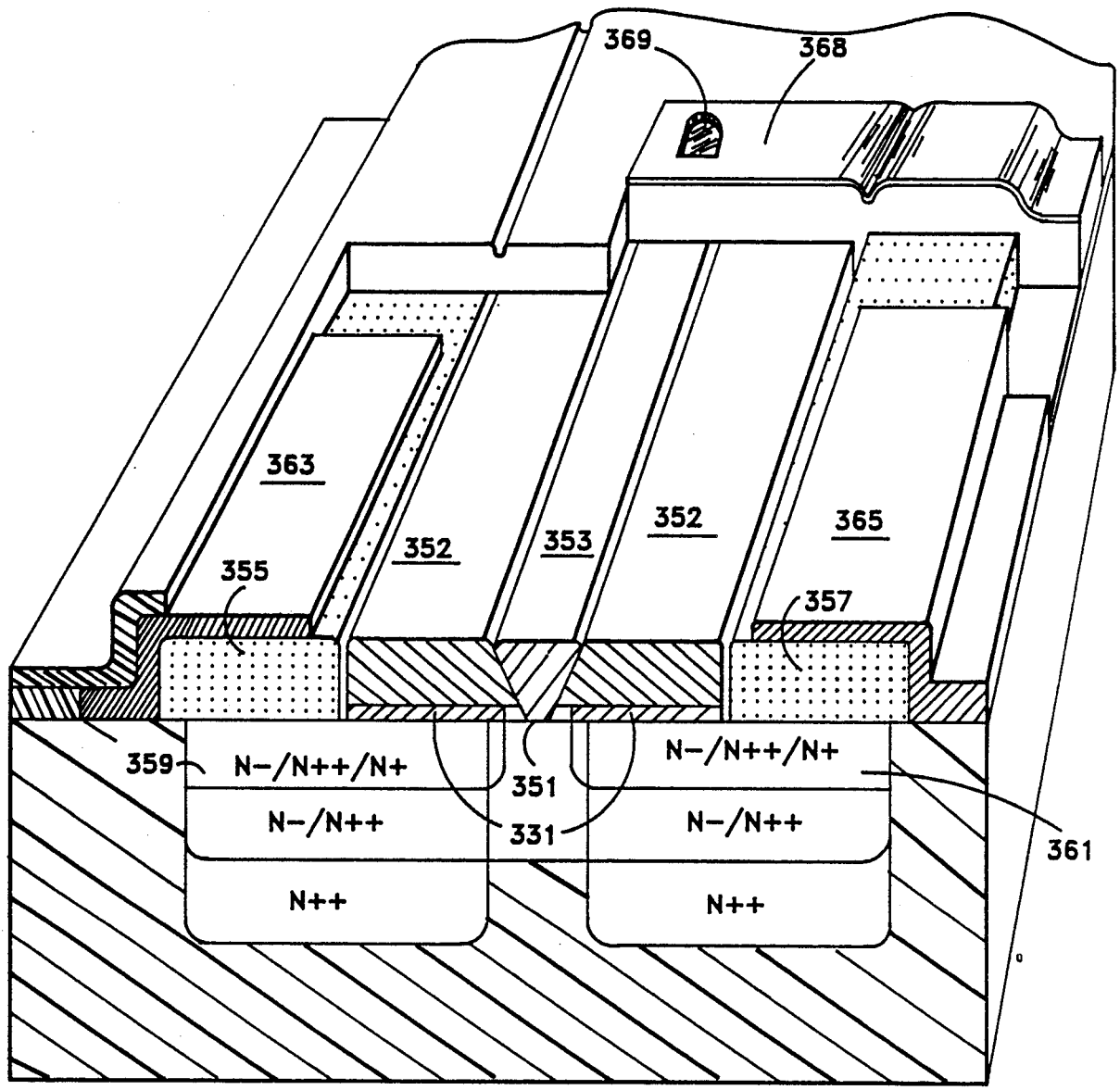
FIG. 10 is a prespective view of an LDD FET device with interconnections.

FIGS. 9 and 10 picture the LDD FET 350 with submicron gap 351 in SiO 352 over $Si_3N_4$331, gate 353 length dimension $X_R$, ohmic metal 355 and 357 for source 359 and drain 361, source interconnect 363, drain interconnect 365 and gate interconnect 368 and via 369.

The LDD digital device has excellent leakage characteristics which would normally worsen as the size (gate length) is shrunk. However, the subject process permits changing the profile as the device size is decreased to maintain the excellent leakage parameters. Concurrently the LDD digital device provides an optimal tradeoff of device capacitance, resistance, and breakdown voltage.

This device is also capable of good function in the microwave frequency range and may be made by the combined process.

Certain modifications may be made to the processes herein disclosed. For example, the method of FIG. 1 is based on the use of a G-line stepper; however, the optional reduction (of FIG. 1B) may be omitted if a stepper capable of 0.5 to 0.6 micron production linewidths is initially used.

What is claimed is:

1. A method of fabricating a semiconductor device, comprising the steps of:
   implanting a first dose of ions into a selected region of a semiconductor substrate to form a lightly doped layer;
   positioning a photoresist mask over said substrate to form masked and unmasked areas;
   implanting a second dose of ions into said selected region to form a heavily doped layer below said unmasked areas while retaining said lightly doped layer below said masked areas;
   reducing a basewidth of said photoresist mask to a range of approximately 1.0 to 0.1 micron by oxygen plasma etching, thereby forming expanded unmasked areas;

depositing a nonconforming dielectric layer atop said masked and expanded unmasked areas;

lifting off said etched photoresist mask, thereby leaving said dielectric layer atop only said expanded unmasked areas;

removing any remaining dielectric dogears with a buffered HF dip;

depositing an anneal encapsulant, annealing the semiconductor device, and removing said anneal encapsulant;

etching said dielectric layer to expose portions of said lightly doped and said heavily doped layers, said exposed portions of said lightly doped layer having a dimension in the range of approximately 1.0 to 0.1 micron; and depositing metallization layers to contact said exposed lightly doped and heavily doped layers, respectively.

2. The method of claim 1, wherein the first implanting step comprises implanting the first dose of ions in a GaAs substrate to form an N− layer in said selected region.

3. The method of claim 2, wherein the step of positioning a photoresist mask includes positioning said mask to form a dummy gate atop said N− layer.

4. The method of claim 3, wherein the second implanting step comprises implanting the second dose of ions to form an N+ layer below said unmasked areas while retaining said N− layer below said dummy gate.

5. The method of claim 4, wherein the step of oxygen plasma etching includes reducing the basewidth of said dummy gate.

6. The method of claim 5, wherein the step of depositing a nonconforming dielectric comprises depositing a layer of silicon monoxide.

7. The method of claim 6, wherein the step of depositing an anneal encapsulant comprises depositing a layer of silicon dioxide.

8. The method of claim 1, wherein said steps of implanting ions comprise implanting ions in a GaAs substrate having a surface film of silicon nitride.

9. The method of claim 1, wherein the step of oxygen plasma etching comprises a first etching of said photoresist mask before said implanting of the second dose of ions to form said heavily doped layer, and a second etching of said photoresist mask after formation of said heavily doped layer.

10. A method of fabricating a MESFET having a gate length in the range of approximately 1.0 to 0.1 micron, comprising the steps of:

implanting a first dose of ions into a selected region of a semiconductor substrate to form a lightly doped layer in said selected region;

positioning a photoresist mask to form masked and unmasked areas over said selected region, said masked area including a dummy gate atop said lightly doped layer;

implanting a second dose of ions into said selected region to form a heavily doped layer below said unmasked areas while retaining said lightly doped layer below said dummy gate;

reducing a basewidth of said dummy gate to a range of approximately 1.0 to 0.1 micron by oxygen plasma etching of said photoresist mask, thereby forming an expanded unmasked area over said selected region;

depositing a nonconforming dielectric layer atop said masked and expanded unmasked areas;

lifting off said etched photoresist mask and dummy gate, thereby leaving said dielectric layer atop only said expanded unmasked area;

removing any remaining dielectric dogears with a buffered HF dip;

depositing an anneal encapsulant, annealing the implanted substrate, and removing said anneal encapsulant;

etching said dielectric layer to expose portions of said lightly doped and said heavily doped layers, said exposed portions of said lightly doped layer forming a gate length in the range of approximately 1.0 to 0.1 micron; and depositing metallization layers to contact said exposed lightly doped and heavily doped layers, respectively.

11. The method of claim 10, wherein the step of oxygen plasma etching comprises a first etching of said dummy gate before said implanting of the second dose of ions to form said heavily doped layer, and a second etching of said photoresist mask after formation of said heavily doped layer.

12. The method of claim 11, wherein the first implanting step comprises implanting the first dose of ions in a GaAs substrate to form an N− layer in said selected region.

13. The method of claim 12, wherein the second implanting step comprises implanting the second dose of ions to form an N+ layer below said unmasked areas while retaining said N− layer below said dummy gate.

14. The method of claim 13, wherein the step of depositing a nonconforming dielectric comprises depositing a layer of silicon monoxide.

15. The method of claim 14, wherein the step of depositing an anneal encapsulant comprises depositing a layer of silicon dioxide.

16. The method of claim 10, wherein said steps of implanting ions comprise implanting ions in a GaAs substrate having a surface film of silicon nitride.

17. A method of fabricating microwave and digital transistors on the same GaAs substrate, comprising the steps of:

implanting a first dose of ions into a selected region of the substrate to form a lightly doped layer;

positioning a photoresist mask to form masked and unmasked areas over the substrate, said masked areas including dummy gates atop said lightly doped layer;

implanting a second dose of ions to form a heavily doped layer below said unmasked areas while retaining said lightly doped layer below said dummy gates;

reducing a basewidth of selected dummy gates to a range of approximately 1.0 to 0.1 micron by a first oxygen plasma etching of said photoresist mask, thereby forming expanded unmasked areas;

depositing a nonconforming dielectric layer atop said masked and expanded unmasked areas;

lifting off said etched photoresist mask and dummy gates, thereby leaving said dielectric layer atop only said expanded unmasked areas;

removing any remaining dielectric dogears with a buffered HF dip;

depositing an anneal encapsulant, annealing the implanted substrate, and removing said anneal encapsulant;

etching first selected areas to expose portions of said lightly doped and said heavily doped layers, said exposed portion of said lightly doped layer forming a digital transistor gate, said gate having a length in the range of approximately 1.0 to 0.1 micron;

etching second selected areas to form a recess in said lightly doped layer, said recess forming a microwave transistor gate having a length in the range of approximately 1.0 to 0.1 micron; and depositing metallization layers to contact said exposed portions of said doped layers and said gates, respectively.

18. The method of claim 17, further comprising the steps of:

implanting the first dose of ions to form an N− layer;

implanting the second dose of ions to form an N++ layer;

implanting a third dose of ions to form an N+ layer;

reducing a basewidth of second selected dummy gates to a range of approximately 1.0 to 0.1 micron by a second oxygen plasma etching of said photoresist mask, thereby forming further expanded unmasked areas; and depositing a layer of silicon monoxide atop said masked and further expanded unmasked areas to form said nonconforming dielectric layer.

19. The method of claim 18, further comprising the step of performing a preliminary oxygen plasma etch of said photoresist mask before said step of implanting the second dose of ions.

20. The method of claim 18, wherein said steps of implanting ions comprise implanting ions in a GaAs substrate having a surface film of silicon nitride.

* * * * *